United States Patent
Abraham et al.

(10) Patent No.: US 9,583,354 B2
(45) Date of Patent: Feb. 28, 2017

(54) SYSTEMS AND METHODS FOR DEPOSITING MATERIALS ON EITHER SIDE OF A FREESTANDING FILM USING LASER-ASSISTED CHEMICAL VAPOR DEPOSITION (LA-CVD), AND STRUCTURES FORMED USING SAME

(75) Inventors: Margaret H. Abraham, Portola Valley, CA (US); David P. Taylor, Hawthorne, CA (US)

(73) Assignee: The Aerospace Corporation, El Segundo, CA (US)

( * ) Notice: Subject to any disclaimer, the term of this patent is extended or adjusted under 35 U.S.C. 154(b) by 484 days.

(21) Appl. No.: 13/196,619

(22) Filed: Aug. 2, 2011

(65) Prior Publication Data

US 2012/0248460 A1 Oct. 4, 2012

Related U.S. Application Data

(60) Provisional application No. 61/469,467, filed on Mar. 30, 2011.

(51) Int. Cl.

| | |
|---|---|
| *H01L 21/20* | (2006.01) |
| *H01L 21/3065* | (2006.01) |
| *C23C 16/01* | (2006.01) |
| *C23C 16/18* | (2006.01) |
| *C23C 16/48* | (2006.01) |
| *B81B 3/00* | (2006.01) |
| *B81C 1/00* | (2006.01) |

(52) U.S. Cl.
CPC ......... *H01L 21/3065* (2013.01); *B81B 3/0021* (2013.01); *B81C 1/00373* (2013.01); *C23C 16/01* (2013.01); *C23C 16/18* (2013.01); *C23C 16/481* (2013.01); *C23C 16/483* (2013.01); *B81B 2203/0109* (2013.01)

(58) Field of Classification Search
CPC ..... B81C 1/00047; C23C 16/18; C23C 16/483
USPC .......................... 257/E21.249, 622; 438/584
See application file for complete search history.

(56) References Cited

U.S. PATENT DOCUMENTS

| | | | |
|---|---|---|---|
| 4,652,463 A | 3/1987 | Peters | |
| 4,744,863 A * | 5/1988 | Guckel | ................. G01L 9/0042 29/621.1 |
| 4,953,387 A | 9/1990 | Johnson et al. | |
| (Continued) | | | |

OTHER PUBLICATIONS

Allen et al., "Microfabricated structures for the in situ measurement of residual stress, Young's modulus, and ultimate strain of thin films," Appl. Phys. Lett. 51(4), Jul. 27, 1996, pp. 241-243.
(Continued)

*Primary Examiner* — Jay C Kim
(74) *Attorney, Agent, or Firm* — Jones Day; Jaime D. Choi

(57) ABSTRACT

Embodiments of the present invention provide systems and methods for depositing materials on either side of a freestanding film using laser-assisted chemical vapor deposition (LA-CVD), and structures formed using same. A freestanding film, which is suspended over a cavity defined in a substrate, is exposed to a fluidic CVD precursor that reacts to form a solid material when exposed to light and/or heat. The freestanding film is then exposed to a laser beam in the presence of the precursor. The CVD precursor preferentially deposits on the surface(s) of the freestanding film.

10 Claims, 25 Drawing Sheets

(56) References Cited

U.S. PATENT DOCUMENTS

| | | | |
|---|---|---|---|
| 5,210,455 A * | 5/1993 | Takeuchi | H01L 41/081 310/324 |
| 5,296,255 A | 3/1994 | Gland et al. | |
| 5,338,416 A * | 8/1994 | Mlcak | H01L 21/3063 205/643 |
| 5,345,213 A | 9/1994 | Semancik et al. | |
| 5,351,163 A | 9/1994 | Dawson et al. | |
| 5,662,814 A | 9/1997 | Sugino | |
| 5,691,063 A | 11/1997 | Davis et al. | |
| 5,715,337 A * | 2/1998 | Spitzer | G02B 27/0172 359/223.1 |
| 5,736,430 A | 4/1998 | Seefeldt et al. | |
| 5,847,489 A | 12/1998 | Satoh et al. | |
| 5,909,048 A | 6/1999 | Sugino | |
| 6,030,851 A * | 2/2000 | Grandmont | G01L 9/0042 430/312 |
| 6,262,637 B1 | 7/2001 | Bradley et al. | |
| 6,384,697 B1 | 5/2002 | Ruby | |
| 6,504,202 B1 | 1/2003 | Allman et al. | |
| 6,610,605 B2 | 8/2003 | Rowlette et al. | |
| 6,627,965 B1 * | 9/2003 | Tuller | B81B 3/0089 257/415 |
| 6,667,182 B2 | 12/2003 | Li et al. | |
| 6,878,567 B2 | 4/2005 | Winer et al. | |
| 6,953,977 B2 | 10/2005 | Mlcak et al. | |
| 7,019,402 B2 | 3/2006 | Andry et al. | |
| 7,148,077 B2 | 12/2006 | Fuertsch et al. | |
| 7,281,304 B2 | 10/2007 | Kim et al. | |
| 7,404,247 B2 * | 7/2008 | Eriksen | G01L 9/0042 257/301 |
| 7,419,915 B2 | 9/2008 | Abraham et al. | |
| 7,419,917 B2 | 9/2008 | Abraham | |
| 7,427,797 B2 * | 9/2008 | Ohguro | B81B 3/0018 257/414 |
| 7,468,608 B2 | 12/2008 | Feucht et al. | |
| 7,608,986 B2 | 10/2009 | Yong et al. | |
| 7,749,907 B2 | 7/2010 | Miyairi et al. | |
| 7,886,575 B2 | 2/2011 | Haskell et al. | |
| 8,390,397 B2 | 3/2013 | Jamneala et al. | |
| 8,629,599 B2 | 1/2014 | Chen et al. | |
| 8,698,376 B2 | 4/2014 | Chen et al. | |
| 2003/0031221 A1 | 2/2003 | Wang et al. | |
| 2004/0004592 A1 | 1/2004 | Ikeda et al. | |
| 2006/0144778 A1 | 7/2006 | Grunthaner et al. | |
| 2006/0185139 A1 | 8/2006 | Larson et al. | |
| 2006/0214745 A1 | 9/2006 | Park et al. | |
| 2007/0090892 A1 | 4/2007 | Larson | |
| 2007/0222336 A1 | 9/2007 | Grannen et al. | |
| 2008/0089007 A1 * | 4/2008 | Oladeji et al. | 361/305 |
| 2008/0185288 A1 * | 8/2008 | Yokokawa | 204/418 |
| 2009/0144963 A1 | 6/2009 | Piazza et al. | |
| 2010/0207246 A1 * | 8/2010 | Booth et al. | 257/532 |
| 2010/0243892 A1 | 9/2010 | Dupont | |
| 2010/0315179 A1 | 12/2010 | Schoepf et al. | |
| 2011/0182320 A1 | 7/2011 | Noda | |
| 2012/0326807 A1 | 12/2012 | Choy et al. | |
| 2013/0187169 A1 | 7/2013 | Taylor et al. | |

OTHER PUBLICATIONS

Arnone et al., "Anisotropic laser etching of oxidized (100) silicon," Appl. Phys. Lett. 54 (3), Jan. 16, 1989, pp. 225-227.
Baum, "Laser chemical vapor deposition of gold," J. Electrochem. Soc.: Solid-State Science and Technology 134(10), Oct. 1987, pp. 2616-2619.
Baum et al., "Laser-induced chemical vapor deposition of aluminum," Appl. Phys. Lett. 55(12), Sep. 18, 1989, pp. 1264-1266.
Boutros et al., "Direct writing of GaAs optical waveguides by laser-assisted chemical vapor deposition," Appl. Phys. Lett. 68(15), Apr. 8, 1996, pp. 2041-2042.
Boyer et al., "Laser-induced chemical vapor deposition of $SiO_2$," Appl. Phys. Lett. 40(8), Apr. 15, 1982, pp. 716-719.
Bromley et al., "A technique for the determination of stress in thin films," J. Vac. Sci. Technol. B 1(4), Oct.-Dec. 1983, pp. 1364-1366.
Chang et al., "Controlling elastic waves with isotropic materials," Appl. Phys. Lett., 98, 121904, Mar. 2011, pp. 1-3.
Chen et al., "Acoustic cloaking in three dimensions using acoustic metamaterials," Appl. Phys. Lett. 91, 183518, Nov. 2007, pp. 1-3.
Cohan et al., "Laser-assisted organometallic chemical vapor deposition of films of rhodium and iridium," Appl. Phys. Lett. 60(11), Mar. 16, 1992, pp. 1402-1403.
Cummer et al, "Full-wave simulations of electromagnetic cloaking structures," Phys. Rev. E 74, 036621, Sep. 2006, pp. 1-5.
Ehrlich et al., "Submicrometer-linewidth doping and relief definition in silicon by laser-controlled diffusion," Appl. Phys. Lett. 41 (3), Aug. 1, 1982, pp. 297-299.
Ehrlich et al., "Laser-induced microscopic etching of GaAs and InP," Appl. Phys. Lett. 36 (8), Apr. 15, 1980, pp. 698-700.
Ehrlich et al., "Laser chemical technique for rapid direct writing of surface relief in silicon," Appl. Phys. Lett. 38 (12), Jun. 15, 1981, pp. 1018-1020.
Houle et al., "Laser chemical vapor deposition of copper," Appl. Phys. Lett. 46(2), Jan. 15, 1985, pp. 204-206.
Ishihara et al, "Laser-assisted chemical vapor deposition of titanium nitride films," J. Appl. Phys. 84(1), Jul. 1, 1998, pp. 596-599.
Jackman et al., "Laser chemical vapor deposition of patterned Fe on silica glass: Observation and origins of periodic ripple structures," J. Appl. Phys. 59(6), Mar. 15, 1986, pp. 2031-2034.
Kitahama et al., "Synthesis of diamond by laser-induced chemical vapor deposition," Appl. Phys. Lett. 49(11), Sep. 15, 1986, pp. 634-635.
Kodas et al., "Kinetics of laser-induced chemical vapor deposition of gold," J. Appl. Phys. 62(1), Jul. 1, 1987, pp. 281-286.
Landstrom et al., "Size-distribution and characterization of tungsten nanoparticles generated by laser assisted chemical vapor deposition and pulsed laser ablation," Proc. of SPIE vol. 4810, 2002, pp. 47-57.
Lee et al., "The fabrication of thin, freestanding, single-crystal, semiconductor membranes," J. Electrochem. Soc., 137(8), Aug. 1990, pp. 2556-2574.
Maki et al., "Laser bilayer etching of GaAs surfaces," Appl. Phys. Lett. 55 (2), Jul. 10, 1989, pp. 91-93.
Mei et al., "Effective mass density of fluid-solid composites," Phys. Rev. Lett. 96, 024301, Jan. 2006, pp. 1-4.
Ozkan et al., "Strain relaxation and defect formation in heteroepitaxial $Si_{1-x}Ge_x$ films via surface roughening induced by controlled annealing experiments," Appl. Phys. Lett. 70(17), Apr. 28, 1997, pp. 2247-2249.
Rill et al., "Photonic metamaterials by direct laser writing and silver chemical vapor deposition," Nature Materials 7, May 2008, pp. 543-546.
Schulmeister et al., "Laser chemical vapor deposition of cobalt thin films," J. Appl. Phys. 72(8), Oct. 15, 1992, pp. 3480-3484.
Sugino et al., "Through-Oxide Cleaning of Silicon Surface by Photo-Excited Radicals," Extended Abstracts of the 19$^{th}$ Conference on Solid State Devices and Materials, IEEE Tokyo Section, Tokyo, Japan, Aug. 25-27, 1987, pp. 207-210.
Sugino et al., "Ultraviolet excited Cl-radical etching of Si through native oxides," Appl. Phys. Lett. 76 (9), Nov. 1, 1994, pp. 5498-5502.
Tamir et al., "Laser induced chemical vapor deposition of optical thin films on curved surfaces," SPIE vol. 3110, pp. 517-526.
Torrent et al., "Broadband acoustic cloaks based on the homogenization of layered materials," Wave Motion, 2011, pp. 1-8.
Vellekoop, "Acoustic wave sensors and their technology," Ultrasonics 36, 1998, pp. 7-14.
Liu et al., "Nanoscale Fabrication Using Thermal Lithography Technique with Blue Laser," IEEE Transactions on Magnetics, 45(5): 2206-2208 (2009).
Meier et al., "Coupling Nanowire Chemiresisitors with MEMS Microhotplate Gas Sensing Platforms," Applied Physics Letters, 91:063118-1 through 063118-3 (2007).
Nabar et al., "A nanoporous silicon nitride membrane using a two-step lift-off pattern transfer with thermal nanoimportant lithography," Journal of Micromechanics and Microengineering, 22:1-8 (2012).
Schmidt et al., "Contact Thermal Lithography," Proceedings of IMECE2005, 2005 ASME International Mechanical Engineering Congress and Exposition, Nov. 5-11, Orlando, Florida, pp. 1-3 (2005).

(56) References Cited

OTHER PUBLICATIONS

Semancik et al., "Microhotplate platforms for chemical sensor research," Sensors and Actuators B, 77:579-591 (2001).
Taylor et al., "Use of Microhotplate Arrays as Microdeposition Substrates for Materials Exploration," Chem. Mater., 14:1671-1677 (2002).
Tserepi et al., "Fabrication of suspended thermally insulating membranes using frontside micromachining of the Si substrate: characterization of the etching process," Journal of Micromechanics and Microengineering, 13:323-329 (2003).
Wheeler et al., "Chemical crosstalk between heated gas microsensor elements operating in close proximity," Sensors and Actuators B, 77:167-176 (2001).
United States Patent and Trademark Office, Non-final Office Action for U.S. Appl. No. 13/797,549, mailed Jul. 9, 2014.
Atwater and Polman, "Plasmonics for improved photovoltaic devices," Nat. Mater. 9(3)205-213 (2010) (Epub Feb. 19, 2010).
Diest et al., "Tunable Color Filters Based on Metal-Insulator-Metal Resonators," Nano Lett. 9(7):2579-2583 (2009).
Kao et al., "'Digitally' Addressable Focusing of Light into a Subwavelength Hot Spot," Nano Lett. 12:2728-2731 (2012).
United States Patent and Trademark Office, Final Office Action for U.S. Appl. No. 13/797,549, mailed Feb. 2, 2015 (5 pages).
United States Patent and Trademark Office, Final Office Action for U.S. Appl. No. 13/797,549, mailed Jan. 4, 2016 (5 pages).
United States Patent and Trademark Office, Non-Final Office Action for U.S. Appl. No. 13/797,549, mailed Jul. 22, 2015 (7 pages).
United States Patent and Trademark Office, Non-Final Office Action for U.S. Appl. No. 13/797,549, mailed Jul. 19, 2016 (7 pages).

* cited by examiner

SYSTEMS AND METHODS FOR DEPOSITING MATERIALS ON EITHER SIDE OF A FREESTANDING FILM USING LASER-ASSISTED CHEMICAL VAPOR DEPOSITION (LA-CVD), AND STRUCTURES FORMED USING SAME

CROSS-REFERENCE TO RELATED APPLICATIONS

This application claims priority under 35 U.S.C. §119(e) to U.S. Provisional Patent Application No. 61/469,467, filed Mar. 30, 2011 and entitled "Systems and Methods for Depositing Materials on Either Side of a Freestanding Film Using Laser-Assisted Chemical Vapor Deposition (LA-CVD), and Structures Formed Using Same," the entire contents of which are incorporated by reference herein.

FIELD

This application generally relates to depositing materials using laser-assisted chemical vapor deposition (LA-CVD).

BACKGROUND

As is known in the art, metal-insulator-metal (MIM) structures have a variety of potential applications, including as components of electrical devices, e.g., capacitors; optical devices, e.g., etalons; and micro-electrical mechanical devices (MEMs).

However, the range of potential uses of MIM structures has been constrained by the difficulty of their fabrication using prior art methods, as well as the limited types of structures that can be made using same. For example, FIGS. 1A and 1B illustrate cross-sectional views of a prior art method for fabricating MIM structures. As illustrated in FIG. 1A, a patterned mask 150 is applied to the lower surface 120 of an insulative substrate 110, e.g., using known photolithography and wet chemistry techniques. An insulator layer 155, e.g., silicon nitride (SiN), is applied to the upper surface 121 of substrate 110. The masked substrate 110 is then exposed to an appropriate etchant, such as potassium hydroxide (KOH), which removes a portion of substrate 110 so as to form cavity 130 in the back-side of substrate 110. The etching process releases a portion of insulator layer 155 from the underlying substrate 110. As illustrated in FIG. 1B, the photolithographic mask 150 may be removed, and metal layers 160, 170 applied to the exposed portion of oxide layer 155, for example using sputtering, so as to form a MIM structure.

FIGS. 2A-2B illustrate cross-sectional views of a different prior art method for fabricating a MIM structure. As illustrated in FIG. 2A, a buried sacrificial layer 220 such as $SiO_2$ may be provided in substrate 210, and a MIM structure including insulator layer 250 sandwiched between metal layers 240, 260 may be disposed on a portion of the substrate 211 that at least partially overlies the buried sacrificial layer 220. As illustrated in FIG. 2B, substrate 210 may be exposed to an appropriate etchant, such as hydrogen fluoride (HF), or xenon difluoride ($XeF_2$), which removes sacrificial layer 220 and defines a cavity 230. A residual portion 211 of substrate 210 overhangs cavity 230, upon which MIM structure 240, 250, 260 is disposed. These structures may be fabricated using known techniques, e.g., photolithography, wet chemistry, sputtering, and the like.

One limitation of techniques such as illustrated in FIGS. 1A-1B and 2A-2B is that the entire substrate must be exposed to chemical etchants in order to create cavities 130 or 230. As such, to avoid the risk of inadvertently etching other structures, only certain types of materials may be used in the substrate and/or one or more masks or protective layers must be provided. This can add multiple processing steps to the MIM fabrication process. Additionally, only certain types of structures may be fabricated. For example, the technique illustrated in FIGS. 2A-2B relies on the excavation of sacrificial layer 220, and as a result, MIM structure 240, 250, 260 rests on a residual portion of the substrate 211 that overhangs cavity 230 from only one side. This overhang may reduce mechanical stability, as well as potential commercial applicability of the resulting device. Moreover, the lower surface of MIM structure 240, 250, 260 is mechanically, thermally, and electrically coupled to substrate portion 211, limiting its applicability for uses that require enhanced isolation, e.g., sensors.

SUMMARY

Embodiments of the present invention provide systems and methods for depositing materials on either side of a freestanding film using laser-assisted chemical vapor deposition (LA-CVD), and structures formed using same. Specifically, the freestanding film, which is suspended over a cavity defined in a substrate, is exposed to a fluidic CVD precursor that reacts to form a solid material when exposed to light and/or heat. The freestanding film is then exposed to a laser beam in the presence of the precursor. Because the film is freestanding and thus poorly thermally coupled to the substrate, heat tends to build up in the central portion of the freestanding film, e.g., those portions spaced some distance away from the substrate. The CVD precursor preferentially reacts or decomposes where the heat is built up, thus causing a selective deposition of material on the freestanding film as compared to the substrate, which remains relatively cool as a result of its significantly higher thermal mass. If both sides of the freestanding film are exposed to the CVD precursor, then material may be selectively deposited on both sides of the freestanding film, resulting in a simple fabrication scheme for MIM and other commercially relevant structures. The two sides of the film may also be exposed to different CVD precursors than one another, allowing for the fabrication of a diverse collection of multilayer structures.

Under one aspect of the present invention, a structure comprises a substrate having a cavity defined therein; a film having first and second film surfaces suspended over and spanning the cavity; a first layer disposed on the first film surface; and a second layer disposed on the second film surface.

In some embodiments, the substrate has an upper surface, and the film is disposed on the upper surface of the substrate. In other embodiments, the film is buried below the upper surface of the substrate. The film may be substantially continuous.

The film in some embodiments may include an electrical insulator, and the first layer may include an electrical conductor. In some embodiments the second layer may also include an electrical conductor, which need not necessarily be the same material as that of the first layer. More generally, the first and second layers may be made of different materials than one another, and need not even have the same conductivity type. For example, the first layer may be an insulator, a conductor, or a semiconductor, and the second layer may be an independently selected insulator, conductor, or semiconductor.

The techniques described herein also facilitate structures using a wide variety of materials. The film may, for example, include silicon oxide, hafnium oxide, silicon nitride, diamond-like carbon, graphene, or silicon carbide of a selected phase. The substrate may, for example, include silicon, germanium, gallium phosphide, gallium nitride, gallium arsenide, or indium phosphide.

The cavity may be isotropically defined in the substrate and/or may have a substantially uniform depth. Such cavities may be obtained, for example, using LACE techniques such as described herein and in the incorporated patent references mentioned below.

Under another aspect of the present invention, a method of preparing a structure includes providing a film having first and second film surfaces suspended over and spanning a cavity defined in a substrate; exposing the first film surface to a first fluidic precursor; and irradiating the first film surface with a laser beam in the presence of the first fluidic precursor. Heat generated by the laser beam builds up at the first film surface, which converts the first fluidic precursor to a first layer disposed on the first film surface. Note that other methods of heating the film may also be suitable, such as electron beam-based heating or ion beam-based heating.

The method may further include exposing the second film surface to a second fluidic precursor; and irradiating the second film surface with a laser beam in the presence of the second fluidic precursor. Heat generated by the laser beam builds up at the second film surface, which converts the second fluidic precursor to a second layer disposed on the second film surface. The preparation of the first and second layers may, but need not necessarily, be performed concurrently. For example, the first and second film surfaces may be concurrently exposed to the first and second fluidic precursors, respectively, and also concurrently irradiated with the same laser beam. Optionally, a fluidic channel may be formed in the substrate that allows the fluidic precursor to the first and/or second film surfaces.

In one embodiment, the film comprises an electrical insulator, the first fluidic precursor includes a metalorganic compound, and the first layer includes a metal. The second fluidic precursor may also include a metalorganic compound, and the second layer a metal. The metals of the first and second layers may, but need not necessarily, be the same as one another. Materials other than metals also may be deposited on either side of the film and may be selected independently from one another.

In some embodiments, providing the film comprises providing a substrate; providing a film coupled to the substrate; exposing the film and substrate to an etchant; and transmitting a laser beam through the film. The etchant selectively etches the substrate in a region defined by the laser beam so as to define a cavity under the film, thus suspending the film over and spanning the cavity.

In some embodiments, the etch and material deposition steps may be performed in the same gas cell and/or using the same laser.

DETAILED DESCRIPTION

Figure 1A:
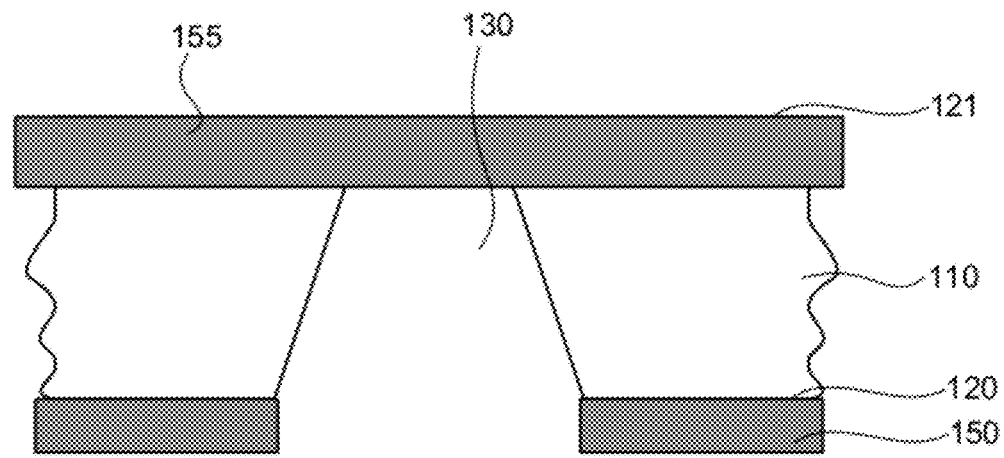
FIGS. 1A-1B schematically illustrate cross-sectional views of structures formed during the preparation of prior art metal-insulator-metal (MIM) structures.

Embodiments of the present invention provide systems and methods for depositing materials on either side of a freestanding film using laser-assisted chemical vapor deposition (LA-CVD), and structures formed using same. For example, embodiments of the present invention allow for the preparation of multilayer structures that are based on "freestanding" films, that is, films that are disposed on or buried within a substrate, and are suspended over a cavity defined in the substrate. Without wishing to be bound by any theory, it is believed the freestanding nature of such films facilitates LA-CVD by causing a spatially confined buildup of laser-induced heat, which in turn causes a spatially confined reaction of a CVD precursor and concomitant deposition of material on the film.

Specifically, it is believed that the suspended portions of such films are relatively poorly thermally coupled to the substrate, because the films only physically contact the substrate at the boundary of the cavity and are otherwise out of physical contact with the substrate. As such, irradiation of the film with laser light causes a buildup of laser-deposited heat within the suspended portion of the film, because only a small portion of that heat may diffuse into the substrate via the relatively small physical contact between the film and substrate at the cavity boundary. Moreover, any irradiation of the surrounding substrate or the bottom of the cavity may result in a relatively small heat buildup in those regions, because those regions are relatively well thermally coupled to the rest of the substrate by virtue of their physical contact. The resulting selective heat buildup in the freestanding portion of the film may be used to facilitate selective chemical vapor deposition (CVD) of materials onto either side of the film. Specifically, either side of the freestanding film may be exposed to a CVD precursor while the film is exposed to a laser beam. Because the laser beam selectively heats the freestanding film, but does not significantly heat the substrate as compared to the film, the CVD precursor may decompose or otherwise react selectively at the freestanding portion of the film, thus resulting in the deposition of a material layer thereon. By controlling the composition of the CVD precursor to which each side of the freestanding portion of the film is exposed during laser irradiation, materials may be selectively deposited on either side of the film. Thus, embodiments of the present invention allow for the "direct writing," via LA-CVD, of independently selected materials onto either side of a freestanding film. Although many different combinations of materials may be used, it will be appreciated that metal-insulator-metal (MIM) structures constitute a conspicuous example of commercially applicable structures facilitated by the present invention. It should further be noted that mechanisms other than spatially confined thermal buildup may facilitate localized deposition of materials on freestanding films. Other methods of heating the film may also be suitable, such as electron beam-based heating or ion beam-based heating.

First, some exemplary structures that may be formed under the present invention, and an illustrative method for forming same, will be provided. Then, various alternative embodiments of structures that may be formed will be described. Then, an exemplary system for forming freestanding films will be described. Lastly, several examples of freestanding films, and some alternative embodiments, will be described.

Figure 3:
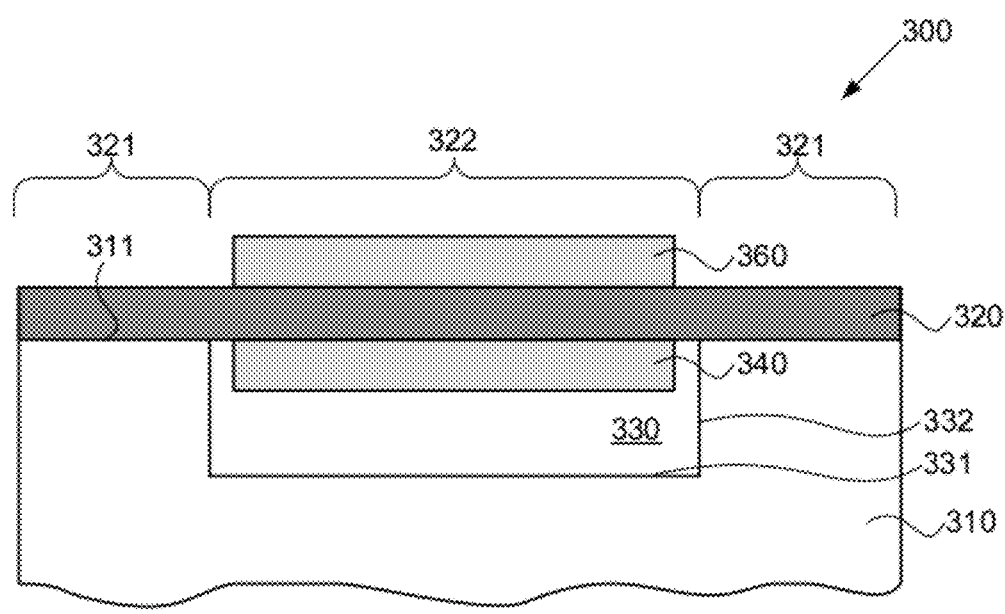
FIG. 3 schematically illustrates a cross-sectional view of a structure that may be formed using laser-assisted chemical vapor deposition (LA-CVD), according to some embodiments.

FIG. 3 illustrates a cross-sectional view of an illustrative structure 300 that may be prepared according to some embodiments of the present invention. Structure 300 includes substrate 310 in which cavity 330 is defined, freestanding film 320, first material layer 340, and second material layer 360.

Substrate 310 may be formed of any suitable material, such as an insulator, a semiconductor, or a conductor. Examples of materials suitable for use in substrate 310 include silicon, germanium, gallium phosphide, gallium nitride, gallium arsenide, and indium phosphide. The substrate may also have structures defined therein, such as conductive lines, insulator layers, doped semiconductor regions, and the like.

Cavity 330 is defined within substrate 310. As can be seen in FIG. 3, cavity 330 has a lower surface 331 and sides 332. In some embodiments, the lower surface 331 of cavity 330 extends substantially parallel to the upper surface 311 of substrate 310, and the sides 332 extend substantially perpendicular to lower surface 331. That is, cavity 330 may be isotropically defined, and may have a substantially uniform depth.

Film 320 is disposed on at least a portion of substrate upper surface 311. In the illustrated embodiment, film 320 covers substantially the entire upper surface 311 of substrate 310, while in other embodiments film 320 is patterned so as to cover only a portion of the upper surface 311 of substrate 310, e.g., using standard techniques known in the art. In still other embodiments, described further below with respect to FIGS. 17A-17C, film 320 is buried within substrate 310. In the embodiment illustrated in FIG. 3, portions 321 of film 320 are disposed on the upper surface 311 of substrate 310, while another portion 322 of film 320 is suspended over cavity 330. Film portion 322 is considered to be "freestanding" because it has substantially no supporting structure directly underneath it. Instead, freestanding film portion 322 is suspended over cavity 330, and held in place via the physical connection between portion 322 and portions 321, i.e., where portion 322 contacts the substrate 310 at the lateral boundary of cavity 330. As such, portion 322 is relatively poorly thermally coupled to substrate 310, which allows for the buildup of heat during LA-CVD that facilitates the selective deposition of first and second material layers 340, 360 within portion 322, as described in greater detail herein.

Film 320 has a chemical composition suitable for the intended purpose of the freestanding film, e.g., film 320 is an insulator layer, or a conductor layer, or a semiconductor layer. The chemical composition of film 320 also preferably is compatible with the processing parameters to be used to form cavity 330 in substrate 310 beneath film 320, as well as the processing parameters to be used to form first and second material layers 340, 360. In some embodiments, film 320 is an oxide, such as $SiO_2$ or hafnium oxide ($HfO_2$), or is a nitride, such as silicon nitride ($Si_3N_4$). In another embodiment, film 320 is a carbon-based film, such as a diamond-like carbon film, a graphene film, or a silicon carbide (SiC) film of controlled phase.

The preparation of suspended or "freestanding" films, such as film 320 suspended over cavity 330, that may be suitable for use in the present invention is described in U.S. patent application Ser. No. 12/869,597, filed Aug. 26, 2010 and entitled "Systems and Methods for Preparing Freestanding Films Using Laser-Assisted Chemical Etch, and Freestanding Films Formed Using Same," the entire contents of which are incorporated herein by reference. However, it should be understood that embodiments of the invention may also be used to deposit materials on freestanding films formed using other methods. For example, U.S. Pat. No. 7,419,915, issued Sep. 2, 2008 and entitled "Laser Assisted Chemical Etching Method For Release Microscale and Nanoscale Devices," and U.S. Pat. No. 7,419,917, issued Sep. 2, 2008 and entitled "Ion Implanted Microscale and Nanoscale Device Method," the entire contents of both of which are incorporated by reference herein, describe alternative methods for preparing thin freestanding films that may be suitable for use in various embodiments of the invention.

First and second material layers 340, 360 are disposed on film 320, within a portion 322 of the film that is suspended over cavity 330. As illustrated in FIG. 3, first and second material layers 340, 360 may be disposed substantially entirely within suspended film portion 322. In some embodiments, layers 340, 360 may have a smaller lateral dimension than does suspended film portion 322; in other embodiments, layers 340, 360 have approximately the same lateral dimension as suspended film portion 322. First and second material layers 340, 360 optionally may be formed of the same material as one another. For example, both of layers 340, 360 may be formed of a conductor; or both may be formed of an insulator; or both may be formed of a semiconductor. Alternatively, first and second material layers 340, 360 may be formed of independently selected materials, e.g., one may be an insulator and the other a conductor; or one may be an insulator and the other a semiconductor; or one may be a conductor and the other a semiconductor. In some embodiments, film 320 is made of an insulator, and first and second material layers 340, 360 are both made of metal, although not necessarily the same metal as one another. Thus, in one embodiment, assembly 320, 340, 360 constitutes a metal-insulator-metal structure suspended over cavity 330, defined in substrate 310. For example, film 320 may be silicon dioxide, and one or both of layers 340, 360 a metal such as platinum, gold, or silver. Or, for example, film 320 may be silicon dioxide, and one or both of layers 340, 360 heavily doped silicon.

Figure 1B:
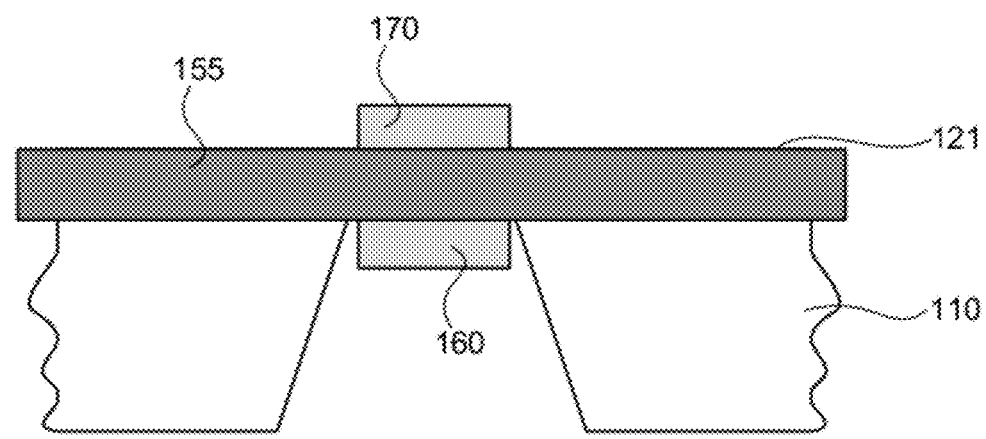

In general, embodiments of the invention allow for structures such as structure 300 to be prepared using any suitable combinations of materials. For example, structure 300 includes freestanding film 320 that is formed of any suitable material, e.g., a material different than the substrate. Film 320 may also be located at any desired position within the thickness of substrate 310. Further, cavity 330 over which film 320 is suspended may be isotropically defined and/or may have substantially the same depth throughout, and may have a lower surface, whereas the prior art structure of FIGS. 1A-1B requires that cavity 130 be etched (which may be an anisotropic process) and that the cavity extend through the entire thickness of substrate 110. That is, prior art cavity 130 has no lower surface. Additionally, unlike the prior art structures of FIGS. 2A-2B, structure 300 includes assembly 320, 340, 360, that is suspended over cavity 330, and thus is poorly thermally coupled to substrate 310. By comparison, assembly 240, 250, 260 is disposed directly on top of portion 211 of substrate 210, and are thus thermally well-coupled to substrate 210.

Figure 2A:
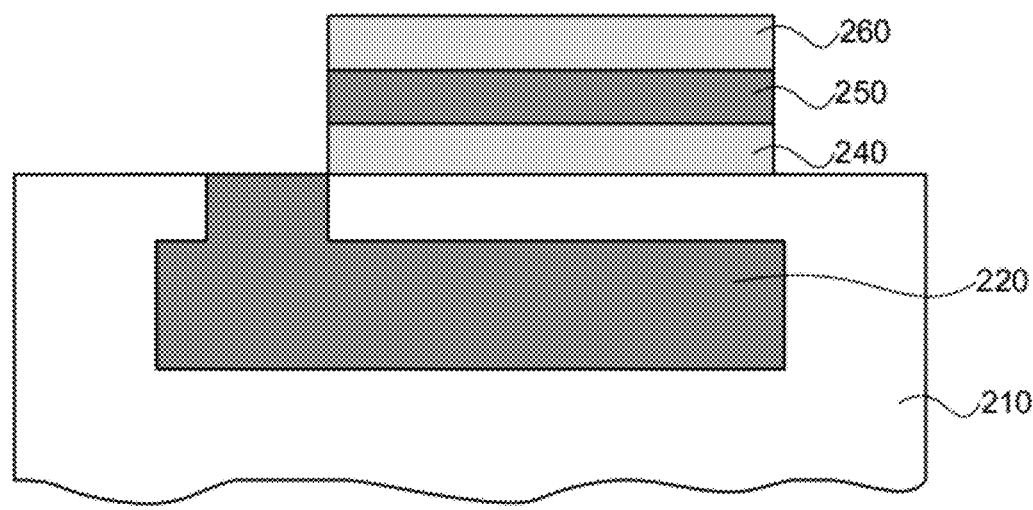
FIGS. 2A-2B schematically illustrate cross-sectional views of structures formed during the preparation of prior art MIM structures.
Figure 2B:
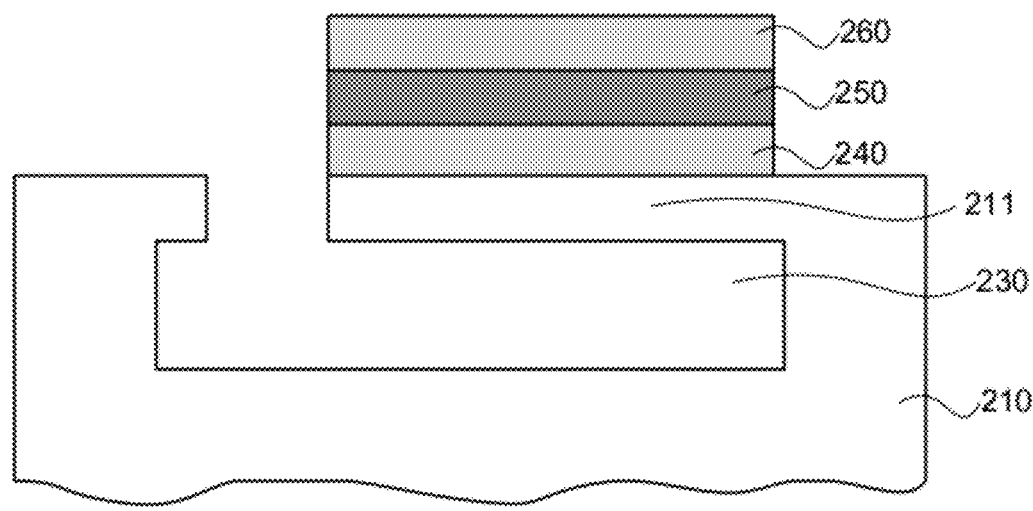

Additionally, in some embodiments, freestanding film 320 and cavity 330 may be prepared using laser-assisted chemical etch (LACE) techniques such as described in U.S. patent application Ser. No. 12/869,597. As described in that application, such techniques may be used to form freestanding films that are substantially continuous, having a substantially uniform thickness and a substantially uniform composition through the thickness, and thus having enhanced structural integrity. Such continuous films may be provided by using a diffusive process that obviates the need to provide through-holes through the film during excavation of the underlying substrate, as required in prior-art structures such as illustrated in FIGS. 2A-2B. For example, as described in U.S. patent application Ser. No. 12/869,597, a structure including a substrate and a film disposed thereon may be exposed to a chemical etchant and to a laser beam. The etchant diffuses through the film and etches the underlying substrate in a region defined by the laser beam, without the need to provide a through-hole or otherwise disturb the structural integrity of the film.

Embodiments in which film 320 is an insulator and material layers 340, 360 are metal may potentially be used in a variety of suitable devices, such as in a MEMS device (e.g., an oscillator used as an accelerometer or as a mass sensor); as an ultracapacitor; or as a plasmonic structure, for example a membrane-based inelastic tunneling photoemitter analogous to that described in Lambe et al., "Light Emission from Inelastic Electron Tunneling," Physical Review Letters, Vol. 37, No. 14, pp. 923-925 (1976), the entire contents of which are incorporated herein by reference.

Figure 4A:
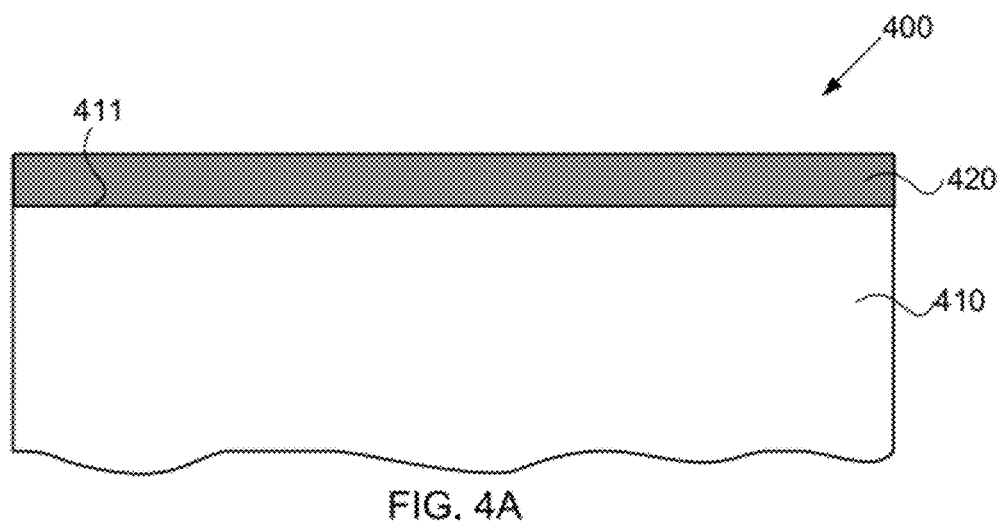
FIGS. 4A-4F schematically illustrate cross-sectional views of structures that may be formed while preparing a structure using LA-CVD, according to some embodiments.

FIGS. 4A-4F illustrate cross-sectional views of structures that may be formed during the preparation of structure 300, according to some embodiments. Specifically, FIG. 4A illustrates precursor structure 400, which includes substrate 410 having upper surface 411, and film 420 disposed on the upper surface 411 of substrate 410. Substrate 410 may be a bulk substrate, such as a semiconductor wafer, optionally having one or more unpatterned and/or patterned films deposited thereon or buried therein. For example, substrate 410 may include one or more conductor layers, and/or one or more semiconductor layers, and/or one or more insulator layers (not shown) beneath upper surface 411, as well as any suitable support for such layers. Examples of suitable substrates include, but are not limited to, silicon (Si), germanium (Ge), gallium phosphide (GaP), gallium nitride (GaN), gallium arsenide (GaAs), and indium phosphide (InP). In one embodiment, the substrate is an Si wafer.

Film 420 is disposed on at least a portion of substrate upper surface 411 using any suitable method. In the illustrated embodiment, film 420 covers substantially the entire upper surface 411 of substrate 410, while in other embodiments (not illustrated), film 420 is patterned so as to cover only a portion of the upper surface 411 of substrate 410. In still other embodiments (not illustrated), film 420 is buried within substrate 410. Examples of the preparation of buried films may be found in U.S. Pat. Nos. 7,419,915 and 7,419,917.

Film 420 has a chemical composition suitable for the intended purpose of the freestanding film, e.g., film 420 is an insulator layer, or a conductor layer, or a semiconductor layer. The chemical composition of film 420 also preferably is compatible with the processing parameters to be used to form a cavity in substrate 410 beneath film 420, as well as the processing parameters to be used to deposit material layers on film 420, during subsequent steps. As such, in some embodiments, film 420 is selected to have a lower thermal conductivity than does substrate 410, so as to facilitate the buildup of heat in film 420 during LA-CVD, which is performed following cavity definition as described in greater detail below. For example, the thermal conductivity of film 420 may be 90% or less of the thermal conductivity of substrate 410, or 80% or less, or 70% or less, or 60% or less, or 50% or less, or 40% or less, or 30% or less, or 20% or less, or 10% or less. Alternatively, the flow of heat from film 420 to substrate 410 during LA-CVD may be constrained, so as to enhance the selectivity of material deposition within suspended portion(s) of film 420, using any other suitable technique. For example, an intervening layer (not illustrated) may be provided between substrate 410 and film 420 that inhibits thermal coupling between the two, e.g., a thin thermal insulator such as an oxide or aerogel.

Additionally, in some embodiments and as described in greater detail in U.S. patent application Ser. No. 12/869,597, the thickness of film 420 optionally may be selected such that a sufficient amount of a suitable chemical etchant may diffuse through the film so as to etch substrate 410 on a practical laboratory timeframe, e.g., within less than 24 hours, or within less than 12 hours, or within less than 6 hours, or within less than 2 hours, or within less than 1 hour, or within less than 20 minutes, or within less than 5 minutes, or within less than 1 minute, or within less than 20 seconds, or within less than 5 seconds, without the requirement for a through-hole such as shown in prior art FIGS. 2A-2B. Film 420 is also at least partially transparent to the wavelength of laser light to be used to enhance the rate of reaction between the etchant and substrate 410. In some embodiments, film 420 is an oxide, such as $SiO_2$ or hafnium oxide ($HfO_2$), or is a nitride, such as silicon nitride ($Si_3N_4$). In another embodiment, film 420 is a carbon-based film, such as a diamond-like carbon film, a graphene film, or a silicon carbide (SiC) film of controlled phase, as described in greater detail below.

Figure 4B:
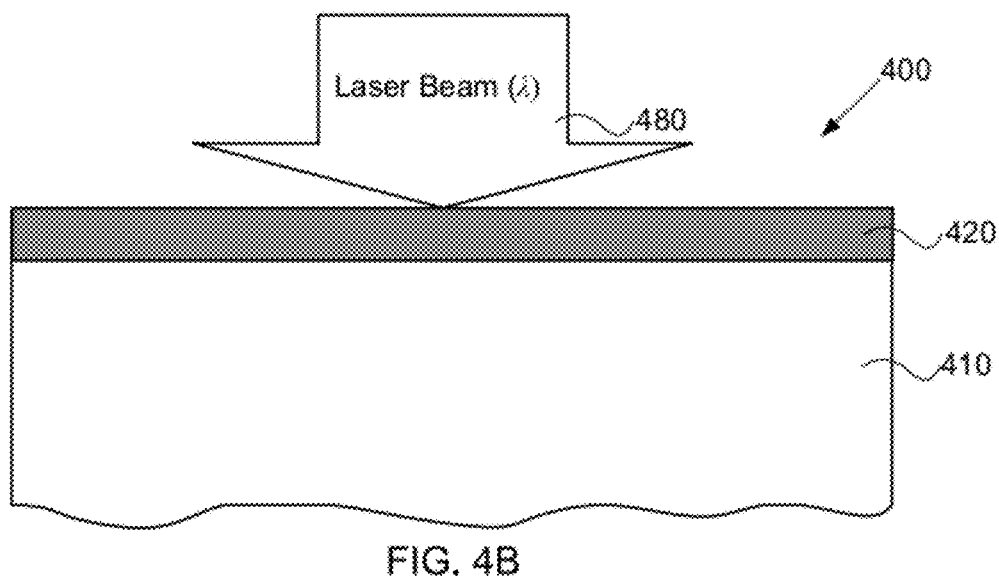

Now referring to FIG. 4B, precursor structure 400 is exposed to a chemical etchant (not shown), such as gaseous chlorine ($Cl_2$), and to laser beam 480, i.e., is exposed to a LACE process. The laser beam 480 and chemical etchant preferably are co-selected to etch substrate 410 selectively relative to film 420. For example, one or more wavelengths ($\lambda$) of light in the laser beam 480 may be relatively strongly absorbed by the substrate 410 as compared to film 420, resulting in selective heating of substrate 420 that speeds the reaction of the etchant with the substrate. Other light-based mechanisms for selectively enhancing the reaction of the etchant with the substrate also may suitably be used. Preferably, the process conditions are selected such that the etch proceeds isotropically, that is, substantially independently of the crystallographic orientation of the substrate. As a result, the cavity may be formed in the substrate so as to have a substantially uniform depth, or any other desired shape.

Figure 4C:
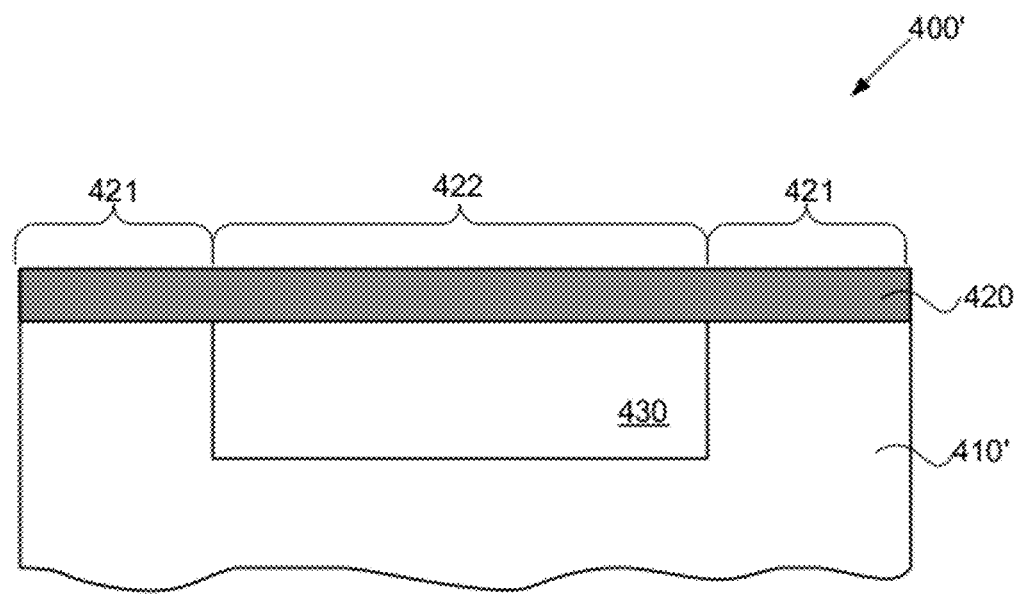

As illustrated in FIG. 4C, exposure to the chemical etchant and laser beam 480 forms structure 400', which includes modified substrate 410' having cavity 430 formed therein. Cavity 430 has a substantially uniform depth defined by the duration of exposure to the chemical etchant and laser beam 480. In the illustrated embodiment, the lateral extent of cavity 430 is defined by the lateral extent of laser beam 480. However, in other embodiments, such as described in the examples below, laser beam 480 may be rastered (scanned) across substrate 420 to form a cavity 430 having lateral dimensions defined by the spatial extents of beam 480 and the lateral dimensions along which the beam was rastered. Such rastering may also be used to prepare multiple cavities in substrate 410' beneath film 420, although only one such cavity 430 is illustrated in FIG. 4C.

In some embodiments, film 420 of structure 400' preferably has substantially the same thickness, continuity, and composition as it did in structure 400, that is, before exposure to the etchant and laser beam 480. In other embodiments, film 420 of structure 400 is initially too thick to permit the etchant to sufficiently diffuse through the film to reach substrate 410, and/or is initially too thick to permit sufficient laser light to penetrate through the film to reach substrate 410, on a practical timeframe. In such embodiments, the chemical etchant and/or the laser light may etch film 420 until the film becomes sufficiently thin for the etchant and/or laser light to reach substrate 410, at which point the etchant preferentially etches the substrate 410 relative to film 420. In either of the two embodiments, however, film 420 preferably remains substantially continuous during exposure to the chemical etchant and laser beam. The reaction products may diffuse through film 420 during processing; alternatively a pressure relief channel may be provided in the substrate, as described in greater detail below. In still other embodiments (not illustrated), film 420 may be patterned so as to include one or more through-holes provided therein, through which etchant and gaseous reaction products may flow.

As illustrated in FIG. 4C, following the LACE process, one or more portions 421 of film 420 remain disposed on the upper surface 411 of substrate 410', while another portion 422 of film 420 is suspended over cavity 430. Film portion 422 is considered to be "freestanding" because it has substantially no supporting structure directly underneath it. Instead, freestanding film portion 422 is suspended over cavity 430, and held in place via portion 422's physical connections to portions 421.

Figure 4D:
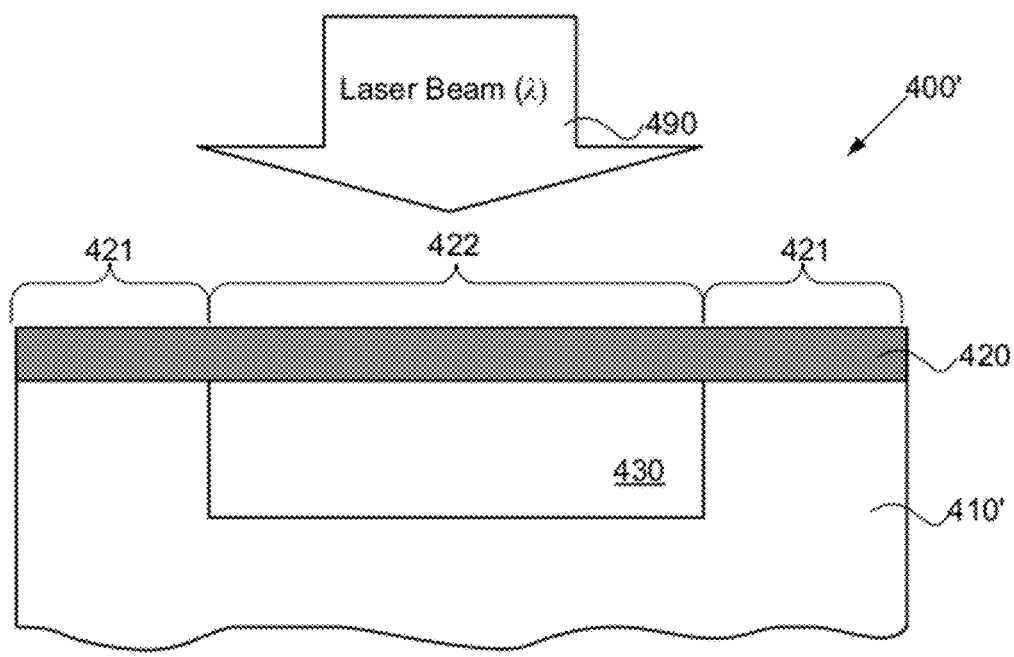

As shown in FIG. 4D, structure 400' may then concurrently be exposed to laser beam 490 and to a fluidic (e.g., gaseous or liquid) CVD precursor (not illustrated). Here, both the lower (first) and upper (second) surfaces of freestanding film portion 422 are exposed to the same CVD precursor, such as a metalorganic compound that decomposes at a predefined temperature into a metal.

Figure 4E:
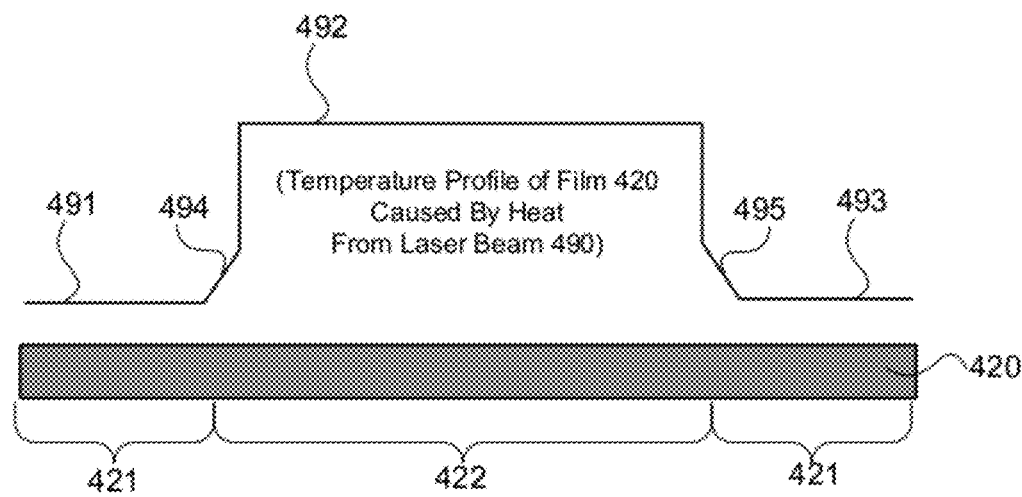

Without wishing to be bound by any theory, it is believed that reduced thermal coupling between freestanding film portion 422 and substrate 410' may cause heat from laser beam 490 to selectively build up within freestanding film portion 422. Such thermal buildup is schematically illustrated in FIG. 4E, from which substrate 410' and laser beam 490 have been omitted, for simplicity. As shown in FIG. 4E, the temperature profile of film 420 caused by heat from laser beam 490 has three distinct regions 491, 492, and 493, which are respectively separated from one another by transition regions 494 and 495. It should be noted that FIG. 4E merely represents one theory of operation of the invention, and should not be construed as binding in any way of the invention. Other mechanisms for facilitating spatially selected LA-CVD may be used.

Temperature profile regions 491, 493 illustrated in FIG. 4E correspond to film portions 421 that are disposed on substrate 410'. Because those film portions 421 are thermally well-coupled to substrate 410' as a result of their being disposed on the upper surface 411 of substrate 410', laser-induced heating within portions 421 may be diffused rapidly into substrate 410'. Because substrate 410' has a relatively large thermal mass compared to film 420, and optionally also has a higher thermal conductivity than does film 420, then substrate 410' effectively and rapidly cools any portions of film 420 that are in contact with substrate 410', i.e., film portions 421. As a result, temperature profile regions 491, 493 have a relatively low temperature.

By comparison, temperature profile region 492 illustrated in FIG. 4E corresponds to suspended film portion 422. That portion 422 is poorly thermally coupled to substrate 410' as a result of its suspension over cavity 430 (not shown in FIG. 4E). Indeed, portion 422 is thermally coupled to substrate 410' substantially only by portions 421. Thus, to the extent that film 420 has a lower thermal conductivity than does substrate 410', portions 421 serve to further slow the transfer of heat out of portion 422 and into substrate 410. Usefully, the rate of heat flow out of suspended portion 422 caused by thermal conduction is less than the rate of heat flow into suspended portion 422 caused by laser beam 490. Thus, higher thermal conductivity films (such as a diamond-like carbon film) may require irradiation with higher laser power to build up sufficient heat to facilitate LA-CVD.

Still referring to FIG. 4E, temperature profile region 492 is relatively high compared to regions 491, which facilitates selective deposition of materials using LA-CVD. Specifically, if the temperature in region 492 is sufficiently high to decompose a CVD precursor or otherwise cause the precursor to react, but the temperature in regions 491 are sufficiently low that the CVD precursor does not react or decompose, then the CVD precursor may selectively react or decompose substantially only at suspended film portion 422, and not at portions 421. The materials from which film 420 and substrate 410' are formed may be selected so as to enhance this effect, e.g., so as to effectively build up heat within suspended portion 422 and effectively diffuse heat within portions 421 that a desired CVD precursor selectively reacts or decomposes at portion 422 but not at portions 421 during laser irradiation. Indeed, without wishing to be bound by any theory, it is believed that even if film portions 421 and/or substrate 410' are directly irradiated with laser light (including the bottom surface of cavity 430), the thermal transport arrangement within the structure may still allow for the creation of a sufficient temperature differential to cause selective material deposition within suspended portion 422. For example, the thermal mass of substrate 410' may be large compared to the thermal mass of film 420, allowing laser-induced heat deposited into the substrate or into film portions 421 in direct physical contact therewith to rapidly diffuse throughout the substrate, keeping the temperatures of substrate 410' and film portions 420 relatively low.

FIG. 4E further illustrates transition regions 494, 495 between high and low temperature regions, corresponding to thermal gradients caused by the different thermal conductivities and thermal masses of film 420 and substrate 410' in the different regions. It should be noted that the shape of such transition regions—and of the temperature profile more generally—may vary depending on the particular thermal conductivity characteristics of the materials, film thicknesses, laser intensity profile, and the like, and that the shape illustrated is intended to be purely illustrative. Moreover, although the temperature profile of FIG. 4E is illustrated as having sharply shaped temperature regions 491, 492, 493, the shapes shown are meant to be purely illustrative of the concept of the suspended film portion 422 having a higher temperature than the non-suspended portions 421, as a result of relatively poor thermal conduction out of portion 422 and into substrate 410'. Further, it should be appreciated that mechanisms other than thermal buildup may be used to selectively deposit materials onto freestanding film portion 422, such as a photodissociative mechanism.

Although not illustrated, that freestanding film portion 422 optionally may be partially or completely freed from structure 400', e.g., using a free-ion beam (FIB) or other suitable technique known in the art, such as mechanical or laser-based cutting, to sever the physical connection(s) between freestanding portion 422 and one or both of portions 421, such as described in U.S. patent application Ser. No. 12/869,597. Such cutting may further inhibit the transfer of heat from portion 422 to substrate 410', and thus may enhance the selectivity of material deposition within portion 422 using LA-CVD. However, in the embodiments illustrated in FIGS. 4A-4F, such cutting has not been performed.

Figure 4F:
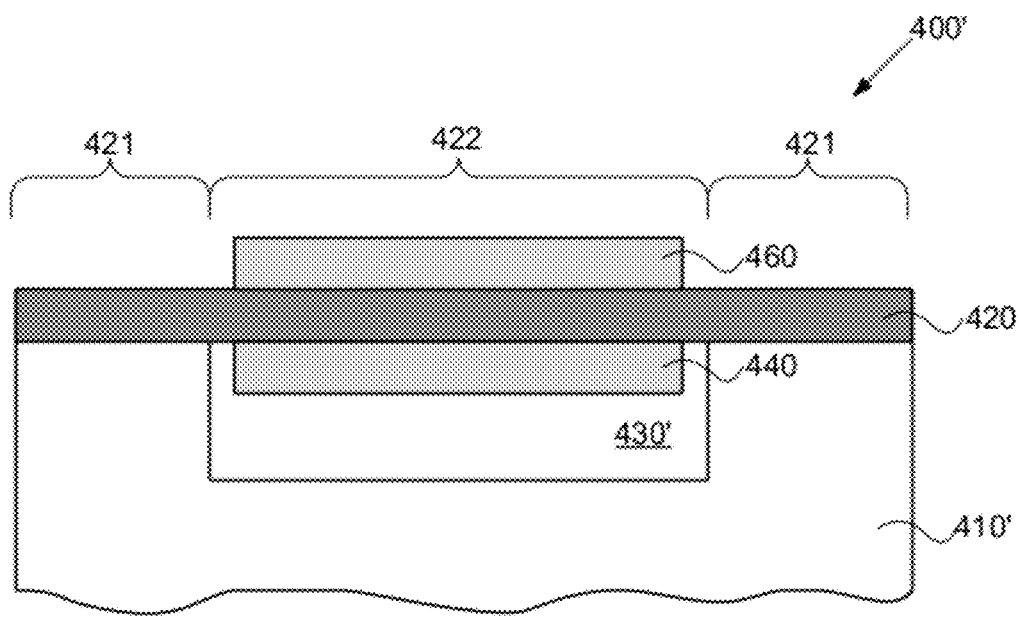

Referring to FIG. 4F, the relatively higher temperature of suspended film portion 422 causes the fluidic CVD precursor to selectively deposit on the lower (first) and upper (second) surfaces of portion 422, forming first and second material layers 440, 460 respectively. In the illustrated embodiment, both the upper and lower surfaces of freestanding film portion 422 were exposed to the same CVD precursor, and thus both material layers 440, 460 are formed of the same material. If film 420 is selected to be an insulator, e.g., a silicon oxide, and the CVD precursor is a metalorganic compound that decomposes or reacts to form a metal, then structure 420, 440, 460 constitutes a metal-insulator-metal (MIM structure) that is relatively well thermally isolated from substrate 410'. That is, there is little thermal conduction between freestanding film portion 422, upon which metal layers 440, 460 are disposed, and substrate 410'.

Generally, any suitable structure may be formed by exposing a desired surface of a freestanding film portion to an appropriate CVD precursor. Preparation of films on the upper and lower surfaces of the freestanding film portion may take place simultaneously or sequentially, and the upper and lower surfaces may be exposed to the same or different CVD precursors as desired to prepare multilayer structures of desired composition.

Any suitable fluidic CVD precursor now known, or developed in the future, may be used to deposit a material layer on either side of a freestanding film using LA-CVD. For example, the preparation of tungsten nanoparticles is described in Landstrom et al., Properties of Metal Nanostructures, Proc. of SPIE, Vol. 4810, pages 47-57 (2002). The preparation of diamond is described in Kitahama et al., Appl. Phys. Lett., Vol. 49(11), pages 634-635 (1986). The preparation of titanium nitride is described in Ishihara et al., J. Appl. Phys., Vol. 84(1), pages 596-599 (1998). The preparation of rhodium and iridium is described in Cohan et al., Appl. Phys. Lett., Vol. 60(11), pages 1402-1403 (1992). The preparation of iron is described in Jackman et al., J. Appl. Phys., Vol. 59(6), pages 2031-2034 (1986). The preparation of gold is described in Kodas et al., J. Appl. Phys., Vol. 62(1), pages 281-286 (1987), and in Baum, J. Electrochem. Soc.: Solid State Science and Technology, Vol. 134(10), pages 2616-2619 (1987). The preparation of $SiO_2$ is described in Boyer et al., Appl. Phys. Lett., Vol. 40(8), pages 716-719 (1982). The preparation of aluminum is described in Baum et al., Appl. Phys. Lett., Vol. 55(12), pages 1264-1266 (1989). The preparation of cobalt is described in Schulmeister et al., J. Appl. Phys., Vol. 72(8), pages 3480-3484 (1992). The preparation of copper is described in Houle et al., Appl. Phys. Lett., Vol. 46(2), pages 204-206 (1985). The preparation of silicon nitride and silicon dioxide is described in Tamir et al., SPIE Vol. 3110, pages 517-526 (1997). The preparation of gallium arsenide is described in Boutrous et al., Appl. Phys. Lett., Vol. 68(15), pages 2041-2042 (1996). The entire contents of each of the references mentioned in this paragraph is incorporated by reference herein, and it should be understood that the precursors and methods used in these references may be adapted in accordance with some embodiments of the present invention to prepare material layers on either side of a freestanding film. Platinum films also may be prepared using suitable techniques described in the art, and as described in greater detail below.

Figure 5:
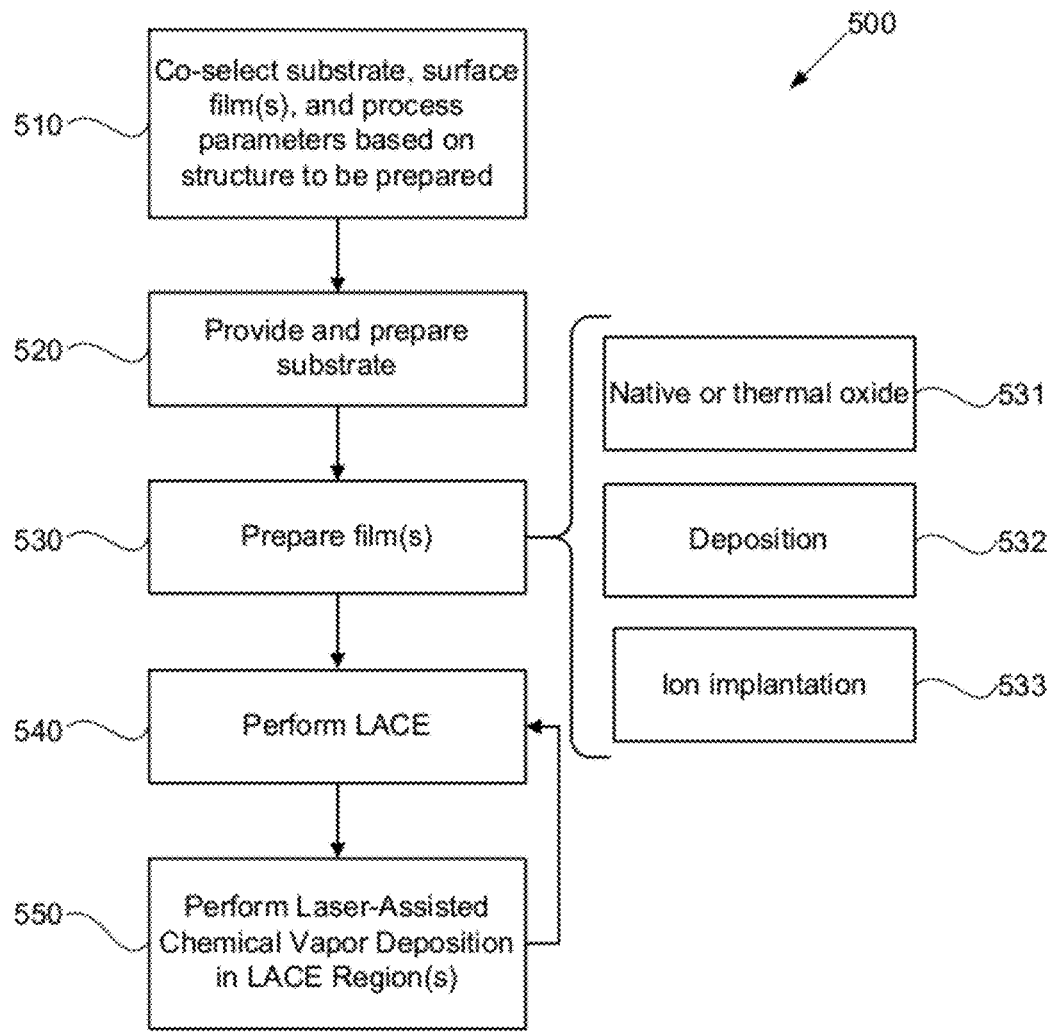
FIG. 5 is a flow chart of steps in an illustrative method for preparing a structure using LA-CVD, according to some embodiments.

Now referring to FIG. 5, an exemplary method 500 of depositing materials on either side of freestanding film using LA-CVD includes co-selecting a substrate, film, materials(s), and process parameters based on the structure to be prepared (step 510). Specifically, the etchant, laser wavelength, and any other process parameters such as pressure and temperature may be selected so as to preferentially etch the substrate relative to the film during preparation of the freestanding film; and the fluidic CVD precursor(s), laser wavelength, and any other process parameters such as pressure and temperature may be selected so as to selectively deposit materials on either side of the freestanding film during LA-CVD. For example, the laser wavelength in the etch step may be selected based on the relative reactivities of the substrate and the film to the etchant when exposed to that wavelength, as well as based on the relative absorption coefficients of the substrate and the film at that wavelength. In some embodiments, the thickness and/or composition of the film may be selected to be at least partially transparent to the laser wavelength so as to allow the light to irradiate the substrate and enhance reaction between the etchant and the substrate. The laser wavelength in the LA-CVD step may be selected based on the relative optical absorption characteristics of the film, substrate, and CVD precursor.

The film composition preferably is compatible with the process parameters to be used to form a cavity in the substrate beneath the film, as well as the LA-CVD process parameters. For example, in some embodiments, the thickness and/or composition of the film(s) may be selected so as to allow the etchant to diffuse therethrough to the substrate on a practical timeframe for the cavity-formation process. Optionally, the thickness and/or composition of the film, as well as the process parameters, are further selected so as to allow the products of the reaction between the etchant and the substrate to diffuse through the film and into the ambient atmosphere on a practical timeframe for the process. Alternatively, a portion of the substrate that extends between the cavity region and a portion of the substrate may be removed (e.g., using LACE) to provide a channel through which the reaction products may flow. In still another alternative, for example where the film has a composition other than solely $SiO_2$ or silicon nitride and/or has multiple layers, access holes optionally may be provided through the film to facilitate contact between the etchant and the substrate.

Then, the selected substrate is provided and prepared (step 520), for example using any suitable technique known in the art. For example, the upper surface of the substrate may be suitably cleaned in preparation for forming a film thereon. As noted above, the substrate may include one or more additional layers therein, including insulators, conductors, and/or semiconductors.

Then, the selected film is prepared (step 530). Depending on the desired composition and thickness of the film, any of a variety of suitable techniques may be used to prepare the film. Preferably, the film is substantially continuous. The film may have any suitable thickness, e.g., between about 1 nm and about 10 μm, or between about 10 nm and about 1 μm, or between about 10 nm and about 300 nm, or between about 100 nm and about 500 nm, or between about 500 nm and 5 μm, or between about 500 nm and 2 μm, or between about 200 nm and 2 μm. For example, in some embodiments, the film is a substantially continuous native oxide that naturally occurs on the surface of the substrate upon exposure to oxygen (step 531). Alternatively, step 531 may include preparing a "thermal oxide" by exposing the substrate to oxygen at high temperature, which may provide a substantially continuous film thicker than a native oxide.

Alternatively, any suitable deposition technique known in the art may be used to prepare the film (step 532), such as chemical vapor deposition (CVD), sputtering, physical vapor deposition (PVD), electrochemical deposition, molecular beam epitaxy (MBE), atomic layer deposition (ALD), or the like. Optionally, the film may be patterned using a suitable patterning technique.

Still another alternative is to prepare a surface film or buried film using ion implantation (step 533). For example, a mask may be provided on the upper surface of a substrate, e.g., using deposition and lithographic patterning, and ions then implanted into the substrate in regions left exposed by the mask. Alternatively, the ions may be patterned using a "direct write" method, without the need for a mask. Some non-limiting examples of suitable ions that may be thus implanted include oxygen (O), hydrogen (H), carbon (C), and nitrogen (N). The depth of the implanted film depends on the energy of the ions, while the thickness of the implanted film depends on the energy distribution of the ions, with a narrower energy distribution providing a thinner film. Following ion implantation, the resulting structure optionally may be further processed as needed, e.g., by annealing at a temperature sufficient for the implanted ions to coalesce into a film or to suitably react with atoms in the substrate. For example, if the substrate is Si and the ions are O, then an anneal step may be used to cause the implanted O ions to bond to the Si substrate to form an $SiO_2$ film. The mask (if any) may then be removed.

Such ion implantation techniques may be used to prepare certain types of films, such as carbon-based films, e.g., diamond-like carbon films, graphene films, and silicon carbide (SiC) films having a preselected phase, that may not be prepared using other methods. The phrase "diamond-like carbon film" means a film formed primarily of C, or essentially of C, or even completely of C. Such film may be formed, for example, using a Si substrate that has an $SiO_2$ film embedded therein. Such an $SiO_2$ film may, for example, be formed by implanting O ions into the substrate and annealing the resulting structure. C ions then may be implanted within the embedded $SiO_2$ film, and the resulting structure subsequently annealed. Such annealing may cause the C ions to bond to each other, resulting in the formation of a "diamond-like" carbon film. The diamond-like carbon film then may be exposed at the surface of the substrate by removing the portion of the substrate and the $SiO_2$ layer that overlie the diamond-like carbon film using LACE, and then portions of the substrate and $SiO_2$ that lie beneath the diamond-like carbon film may be removed, thus providing a freestanding diamond-like carbon film. For further details on systems and methods of preparing diamond-like carbon films, graphene films, silicon carbide (SiC) films having a preselected phase, and other types of films using ion implantation, see U.S. patent application Ser. No. 12/584,939, filed Sep. 14, 2009 and entitled "Systems and Methods for Preparing Films Using Sequential Ion Implantation, and Films Formed Using Same," the entire contents of which are incorporated by reference herein.

Referring still to FIG. 5, LACE is then performed on the film and substrate, e.g., the film and substrate are exposed to the selected etchant and laser beam under suitable process conditions for formation of a cavity in the substrate under a portion of the film (step 540). Examples of suitable etchants include $Cl_2$ gas and fluorine ($F_2$) gas. During such processing, the etchant diffuses through the film and reacts with the substrate, which reaction is enhanced by laser light that the film transmits to the substrate. Additionally, if the film is buried, the etchant first reacts with portions of the substrate overlying the film to expose the film, and then proceeds to excavate a portion of the substrate underlying the film. The reaction products from the etch then may diffuse through the surface film and escape, or optionally may be removed via a pressure relief channel or a through-hole. Such processing results in the isotropic formation of a cavity in the substrate beneath the surface film, creating a freestanding, substantially continuous portion of surface film suspended over a cavity of substantially uniform depth.

LA-CVD is then performed in LACE regions(s) (step 550). For example, as described above, the lower (first) and/or upper (second) surfaces of the freestanding film may be exposed to a desired fluidic CVD precursor, and then exposed to laser light of a suitable wavelength to selectively cause a sufficient temperature increase in the freestanding film as compared to the substrate.

Figure 6:
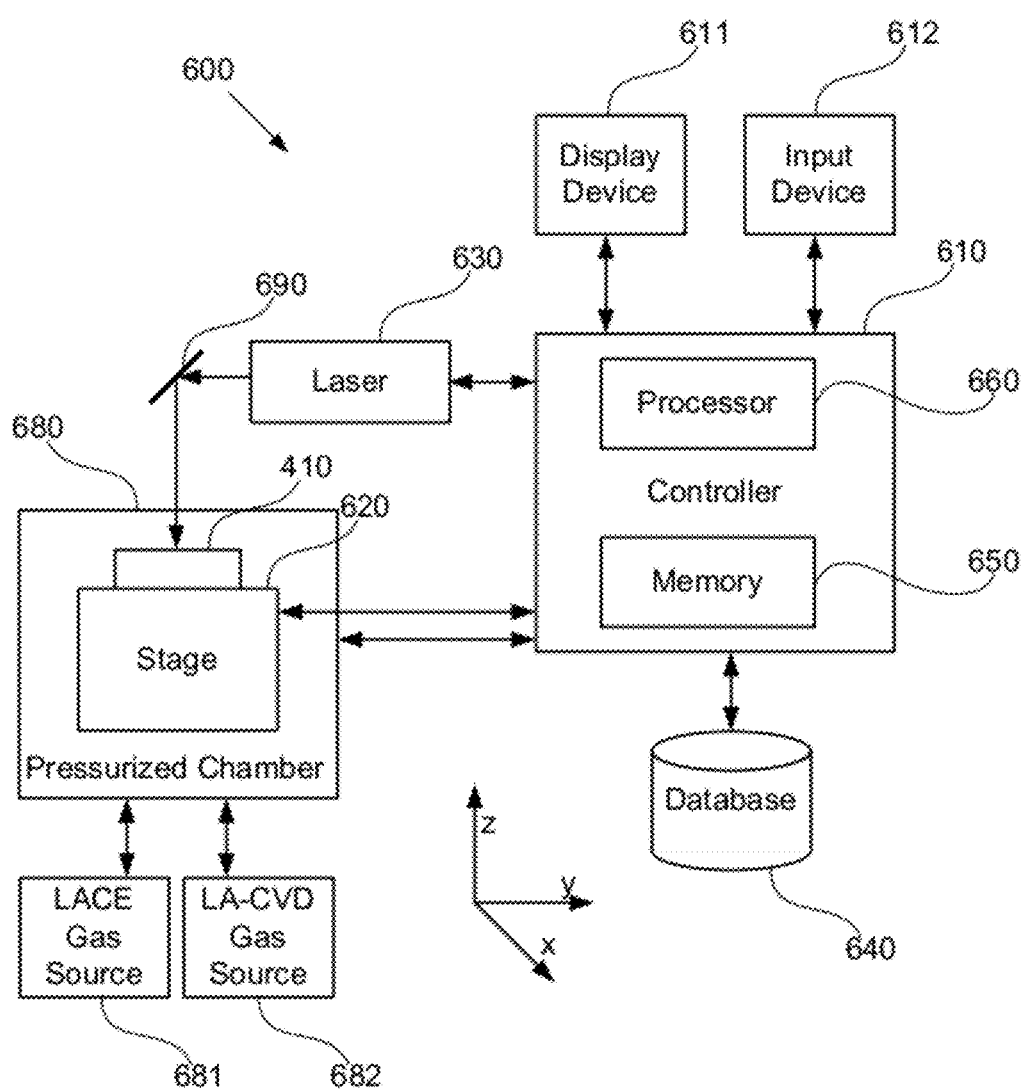
FIG. 6 schematically illustrates a system for preparing a structure using LA-CVD, according to some embodiments.

FIG. 6 schematically illustrates a system 600 for use in preparing freestanding films using LACE and for depositing materials on either side of such films using LA-CVD, according to some embodiments. System 600 includes controller 610, stage 620, laser 630, database 640, pressurized chamber 680, and mirror 690. Controller 610 is in operable communication with stage 620, laser 630, database 640, pressurized chamber 680, and mirror 690 (communication with mirror 690 not shown). Controller 610 includes memory 650 (e.g., a computer-readable medium) for storing processing instructions, processor 660 for executing the stored processing instructions, display device 611 for displaying data to a user, and input device 612 for accepting input from a user. Database 640 contains information on how to prepare a variety of different types of films using sequential ion implantation. Database 640 may be integral to controller 610, or may be remote to controller 610 and in operable communication with controller 610 via a network, such as the Internet.

Stage 620 is positioned within pressurized chamber 680, and supports substrate 410 having a film disposed therein (not shown) and is operable to adjust the position of the substrate in the x, y, and z directions responsive to instructions from controller 610. During LACE processing (step 540 of FIG. 5), Laser 630 emits light of a wavelength $\lambda_1$ selected to preferentially enhance the reaction of the etchant with substrate 410 and form cavity 430 under film 420. During LA-CVD processing (step 550 of FIG. 5), Laser 630 emits light of a wavelength $\lambda_2$ selected to preferentially enhance the deposition of material onto the freestanding portion of film 420. In some embodiments, $\lambda_1$ and $\lambda_2$ are the same as one another; that is, the output of laser 630 need not be adjusted between LACE and LA-CVD steps. In other embodiments, the output of laser 630 is adjusted to provide different wavelengths during LACE and LA-CVD steps. In still other embodiments (not shown) a second laser may be provided to heat the freestanding film during LA-CVD processing at a different wavelength than that used during LACE processing.

Mirror 690 directs the light from laser 630 toward one or more regions of substrate 410 in accordance with instructions from controller 610, preferably through a window in pressurized chamber 680. In an alternative embodiment (not shown), stage 620 is used to move substrate 410 relative to the laser beam, instead of using mirror 690 to direct the light to different portions of substrate 410. Pressure chamber 680 is configured to maintain substrate 410 at a selected pressure of etchant gas from LACE gas source 681 during the appropriate processing time, and then to maintain substrate 410 at a selected pressure of fluidic CVD precursor from LA-CVD gas source 682, responsive to instructions from controller 610. Note that if different materials are to be deposited on either side of the freestanding film, then pressure chamber 680 may provide different fluidic CVD precursors to different portions of substrate 410 as appropriate to achieve this effect.

Responsive to user input provided through input device 612, e.g., user input defining the type and dimensions of freestanding film to be prepared, controller 610 requests database 640 to provide information on how to prepare that type of film. Responsive to the request, database 640 provides some or all of the following information to controller 610: the type of substrate 410 to be used; any required preparation thereof; the wavelength(s) of laser light to be used; the type of etchant to be used during LACE processing and the pressure thereof; the type(s) of CVD precursors and the pressure(s) thereof; and any additional processing to be performed after exposing the substrate 410 to the etchant and laser light and/or to the CVD precursor(s) and laser light. Controller 610 receives this information and stores it in memory 650. Processor 660 processes the stored information, and based on that information displays instructions to the user via display device 611 and controls stage 620, laser 630, pressurized chamber 680, and mirror 690 to process the substrate 410 as appropriate.

In one example, the user uses input device 612, e.g., a keyboard and mouse, to input to the controller that he desires to prepare a freestanding $SiO_2$ film having platinum deposited on either side thereof. Responsive to that input, controller 610 requests database 640 to provide information on preparing such a structure. Responsive to the request, database 640 provides a set of instructions to the controller 610, which controller 610 stores in memory 650. Processor 660 then processes the stored instructions to determine what information is to be displayed to the user via display device 611, and how the various components of the system are to be controlled. For example, processor 660 determines, based on the stored instructions, that substrate 610 is to be an Si wafer, and that an $SiO_2$ film is to be separately provided thereon using suitable methods, such as ion implantation. Processor 660 then causes this information to be displayed to the user via display device 611 so that the user may separately obtain the Si substrate and provide the $SiO_2$ film thereon. Note that in some embodiments, System 600 is further configured to perform ion implantation, and thus may perform this step as well without user intervention.

Next, the user places the prepared Si substrate 410 with $SiO_2$ film thereon on stage 620, and uses input device 612 to inform controller 610 that the substrate is ready. Responsive to this input, processor 660 instructs stage 620 to move to a first pre-determined position in the x, y, and z directions and instructs pressurized chamber 680 to expose substrate 410 to a suitable etchant from LACE gas source 681 at a suitable pressure, based on the stored instructions. Processor 660 then instructs laser 630 to emit light having wavelength $\lambda_1$, and instructs mirror 690 to guide that light to the appropriate region(s) of substrate 410. In some embodiments, the etchant diffuses through the $SiO_2$ film and undergoes an enhanced reaction with substrate 410 responsive to exposure to the light, thus forming a cavity in the substrate having a freestanding $SiO_2$ film suspended thereover. In other embodiments, a fluidic pathway is provided to the substrate 410 to facilitate the etch. Processor 660 instructs stage 620 to move to a second pre-determined position in the x, y, and z directions and instructs pressurized chamber 680 to expose substrate 410 to a suitable CVD precursor from LA-CVD gas source 682 at a suitable pressure, based on the stored instructions. Processor 660 then instructs laser 630 to emit light having wavelength $\lambda_2$, and instructs mirror 690 to guide that light to the appropriate region(s) of substrate 410, e.g., to one or more regions previously processed with LACE that now include a freestanding film. The light of wavelength $\lambda_2$ selectively heats the freestanding film, causing decomposition or reaction of the CVD precursor at the film and thus causing deposition of a selected material on the film. Then, depending on the further processing defined in the stored instructions, processor 660 may display instructions to the user via display device 611 regarding any additional steps the user is to perform.

Those of skill in the art will appreciate that any of the user-performed steps may alternatively be automated using commercially available equipment (not illustrated). For example, instead of displaying to the user what type of substrate and film is to be provided, controller 610 may instead be in operable communication with a robotic substrate handler that may obtain substrate 410 from a substrate store, and may process the substrate as required to provide the film thereon and then etch the substrate to make the film freestanding and deposit a material layer thereon. In one embodiment, one or more steps of an instruction sequence are made contingent on a feedback parameter, such as a spectrum of light reflected from the substrate, or a change in reflectivity of the substrate resulting from deposition of material.

For example, a pulsed laser beam from a separate probe laser (not shown) may be used to periodically irradiate a region of the substrate 410 where the material is being deposited, and a reflected portion of the probe beam then input into a photodetector (also not shown) in communication with controller 610. The output of the photodetector may be analyzed to determine whether a material had been deposited on the region of the substrate, and if so, how much. For example, controller 610 may include software stored in memory 650 operable on processor 660 for determining, based on the photodetector output, whether the reflectivity of the substrate changed as a result of material deposition in the irradiated region, and/or whether the reflectivity indicates that a sufficient thickness of material has been deposited in that region. If the controller 610 determines that the material has been deposited to a sufficient thickness, then controller 610 may instruct stage 620 to move substrate 410 such that a different region of the substrate is irradiated by laser 630 and by the probe laser.

Although the above-described embodiments have primarily been described with reference to use of a continuous-wave laser to locally heat the substrate during LACE and LA-CVD, a pulsed laser alternatively may be used. Such a pulsed laser may also be compatible with a pulsed-probe feedback scheme, such as described above. Indeed, in one embodiment, the same pulsed laser may be used to generate pulses for heating substrate 410 for LA-CVD, as well as to generate probe pulses for determining whether material was deposited. For example, the pulsed laser may be configured to alternately emit relatively large pulses for depositing material with LA-CVD, and relatively small probe pulses for use in analyzing the deposited material. The controller 610 may be configured to move the substrate 410 after a probe pulse indicates that a sufficient thickness of material has been deposited. Use of a pulsed laser to generate pulses for heating substrate 410 usefully may allow the substrate to partially or completely dissipate heat between pulses, where the temperature of the substrate is based on the time interval between the pulses. Providing such control over the substrate's dissipation of heat may enhance control over the deposition process, in particular reducing the occurrence of "thermal runaway" in which deposited material increases the substrate's photoabsorption of heat, thus increasing the local temperature and therefore the rate at which additional material is deposited.

Some alternative embodiments and non-limiting examples of structures formed using LA-CVD will now be described with reference to FIGS. 7-16.

FIGS. 7A-7D are scanning electron microscopy (SEM) images of an exemplary structure including silicon dioxide ($SiO_2$) film 720 disposed on an Si substrate 710. $SiO_2$ film 720 includes a freestanding portion upon which platinum films 740, 760 are disposed. The $SiO_2$ film 720 was prepared by growing a thermal oxide on the upper surface of an Si substrate that was cleaned using conventional methods. A region of Si substrate 710 was then excavated from beneath $SiO_2$ film 720 using LACE processing that included exposing the structure to $Cl_2$ gas of approximately 400 mTorr pressure and approximately 2.5 W of light from a broad-spectrum continuous-wave (CW) argon-ion laser and focused to a beam waist of approximately 3 μm. The laser beam was rastered over substrate 710 in a rectangular pattern, resulting in a corresponding rectangular cavity over which a freestanding portion of $SiO_2$ film 720 was suspended. Platinum was then deposited on both sides of the freestanding portion of $SiO_2$ film 720 using LA-CVD. Specifically, $SiO_2$ film 720 was exposed to the CVD precursor gas tetrakis(trifluorophosphine) platinum (Strem Chemicals, Inc., Newburyport, Mass.) at a pressure of approximately 1 torr, and irradiated with 10 mW of light from the same argon-ion laser as used above, which was again focused to a beam waist of approximately 3 μm. The laser beam was rastered over substrate 710 in a rectangular pattern, resulting in the deposition of platinum on both sides of the freestanding portion of $SiO_2$ film 720.

Figure 7A:
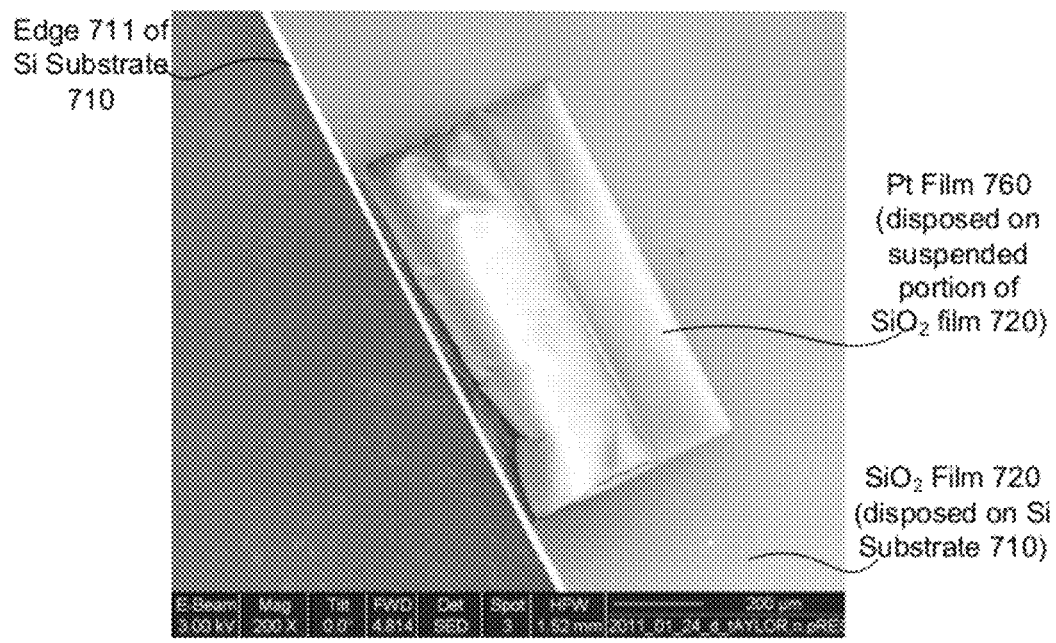
FIGS. 7A-7D are scanning electron microscopy (SEM) images of structures formed using LA-CVD, according to one example.
Figure 7B:
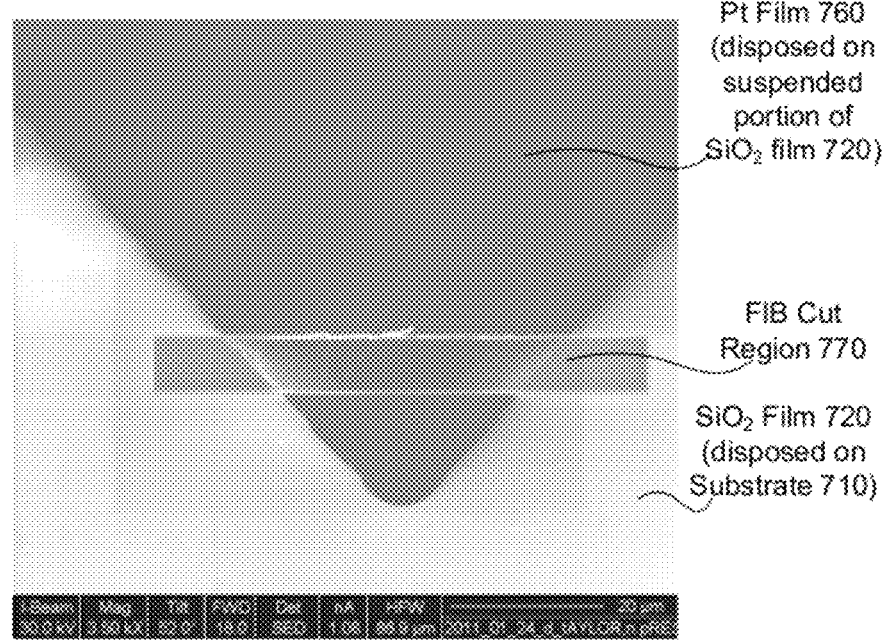
Figure 7C:
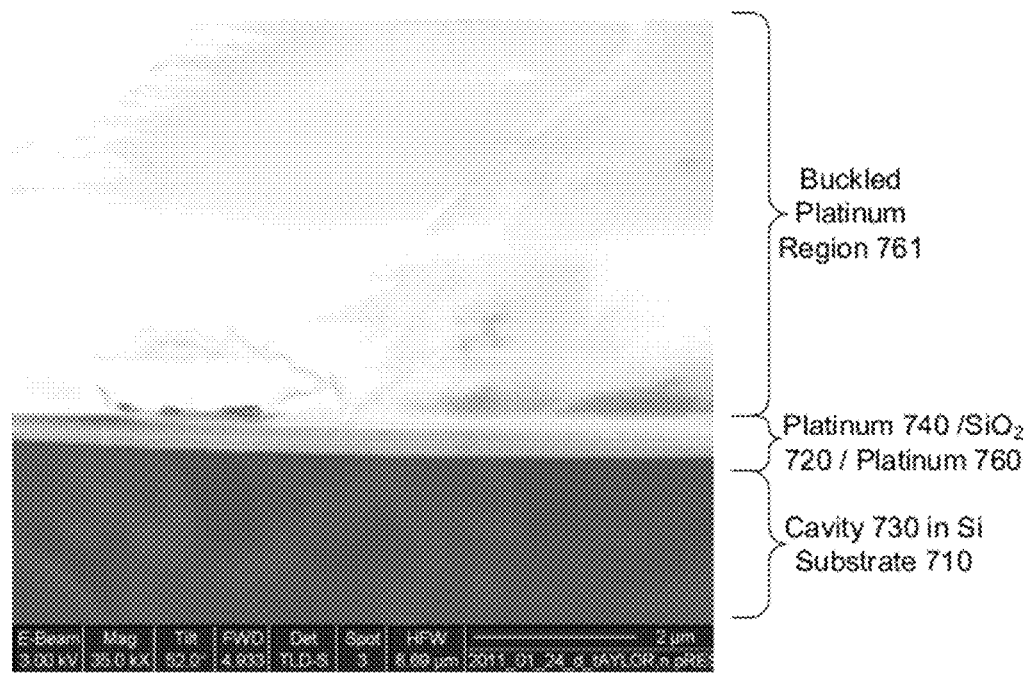
Figure 7D:
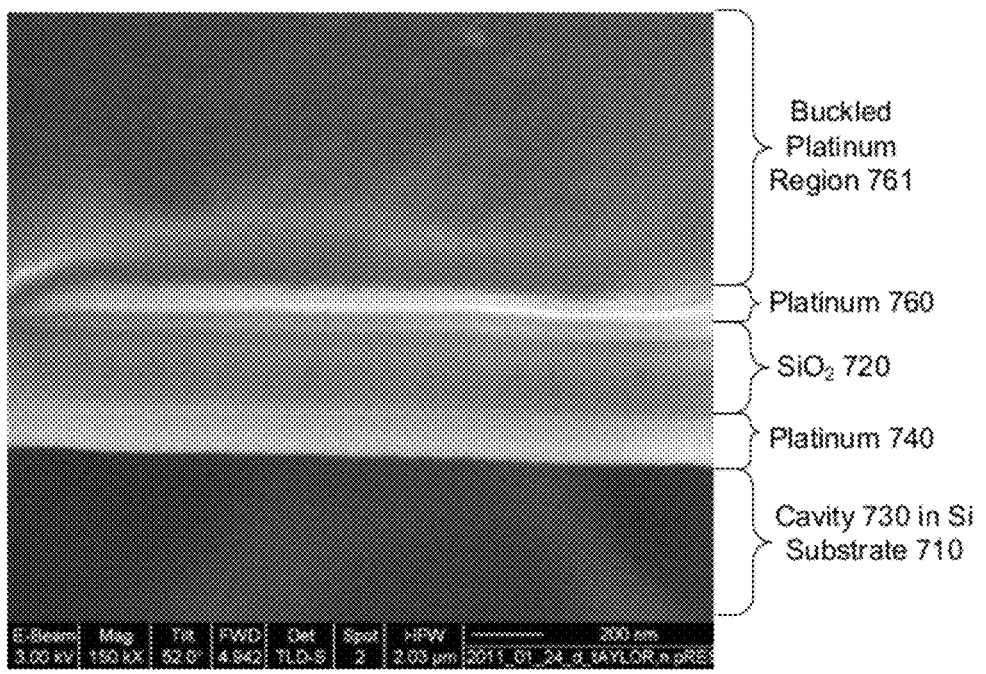

As can be seen in FIG. 7A, upper platinum layer 760 is deposited in a rectangular region defined near the edge 711 of Si substrate 710. This position was selected so that the CVD precursor gas could flow to the lower surface of $SiO_2$ film 720 (not visible in FIG. 7A) from edge 711. Upper platinum layer 760 is believed to appear buckled because of thermal expansion effects arising during the LA-CVD process. A cross-section of the structure shown in FIG. 7A was obtained from region 770, illustrated in FIG. 7B, which intersects at a diagonal one of the corners of upper platinum layer 760. This cross-section was obtained using a focused-ion beam (FIB) cut. FIGS. 7C and 7D are SEM images of this cross section. As can be seen in FIG. 7C, assembly 740, 720, 760 (platinum-$SiO_2$-platinum) is suspended over cavity 730. The lighter section 761 that appears above assembly 740, 720, 760 is believed to correspond to a curled portion of platinum layer 760. FIG. 7D is a higher-magnification image of the structure than shown in FIG. 7C. As can be seen in FIG. 7D, assembly 740, 720, 760 is again suspended over cavity 730. Platinum layer 740 can be seen to be approximately 100 nm thick; $SiO_2$ film 720 is approximately 140 nm thick; and platinum layer 760 has a thickness that appears to be approximately 100 nm, although the apparent buckling of the layer seen in region 761 makes it difficult to accurately determine the thickness based on this image.

The extent to which film 720 buckles may be controlled via the methods and/or materials used to form the film. For example, $SiO_2$ formed by thermal growth tends to form films under compression, that is, films that when freed from the substrate with LACE tend to buckle outwards or inwards over the cavities defined beneath them. $SiO_2$ formed by other methods, such as ion implantation of O ions into Si, tend to be even more compressed than those formed by thermal growth. $SiO_2$ films that have been annealed are expected to exhibit less compression than those formed by thermal growth. By comparison, SiN tends to form films under tension, that is, films that when freed from the substrate with LACE tend to be taut and relatively planar over the cavity defined beneath them. The tension/compression properties of the material may be pre-selected in view of the intended purpose of the film, in some circumstances tension being desirable, and in other circumstances compression being desirable.

The ability to direct-write freestanding films and material layers, optionally using a single system, facilitates the development of many kinds of devices that previously have been difficult or impossible to fabricate, such as photonic, acoustic, and plasmonic devices. In particular, embodiments of the present invention provide the ability to combine MIM sandwich structures with larger structures, such as metamaterials (e.g., metamaterial antennas), and/or with cavities having predetermined depths and shapes.

Figure 8A:
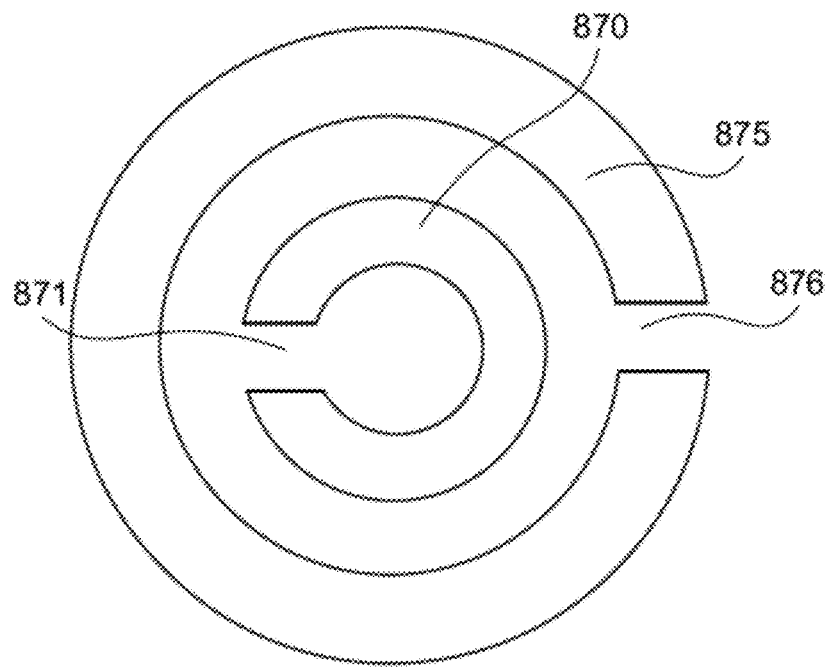
FIGS. 8A-8B schematically illustrate plan views of alternative structures formed using LA-CVD, according to some embodiments.
Figure 8B:
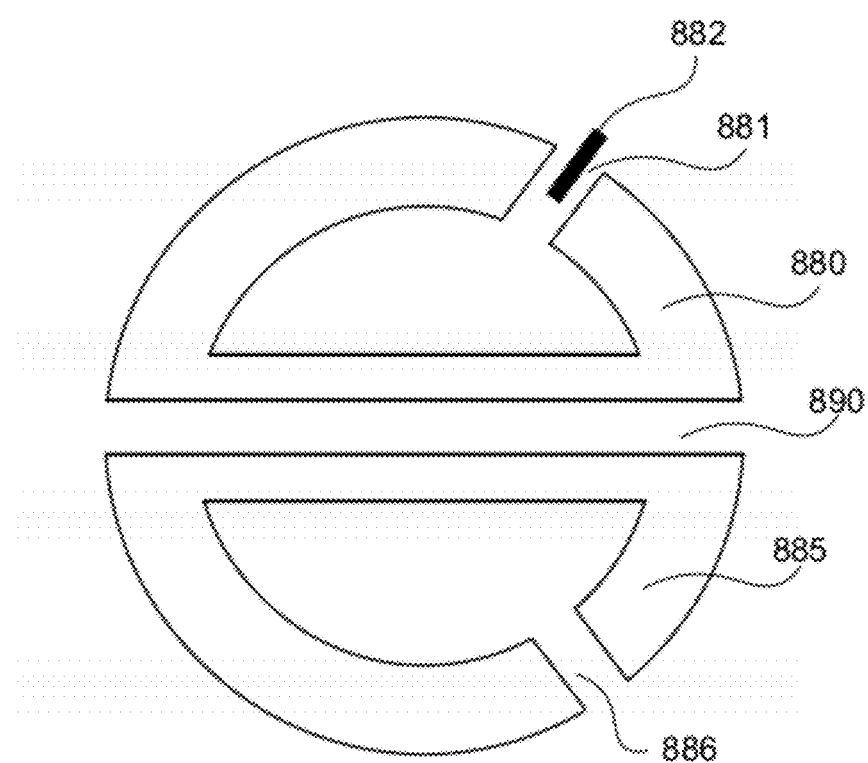

For example, FIGS. 8A-8B illustrate plan views of split-ring resonators (SRRs) that may be fabricated using techniques provided by the present invention. As is familiar to those of skill in the art, SRRs are component parts of certain types of metamaterials, e.g., terahertz metamaterials, or acoustic metamaterials, or metamaterial antennas. FIG. 8A illustrates a first exemplary design for an SRR that includes inner ring 870 having slit 871, and outer ring 875 having slit 876. Rings 870, 875 each include a MIM structure, e.g., a freestanding insulator layer suspended over a cavity that defines the lateral dimensions of the ring, and metal layers disposed on both sides of the insulator layer. FIG. 8B illustrates a second exemplary design for an SRR, that includes first ring 880 having slit 881, and second ring 885 having slit 886. Rings 880, 885 are separated by spacing 890. Rings 880, 885 each include a MIM structure, e.g., a freestanding insulator layer suspended over a cavity that defines the lateral dimensions of the ring, and metal layers disposed on both sides of the insulator layer. The dimensions of rings 880, 885 are selected such that an electromagnetic or acoustic wave of a preselected wavelength suitably resonates within the MIM structures of the rings. The cavities of the structures illustrated in FIGS. 8A-8B further may enhance the performance of the SRRs by inhibiting coupling of electromagnetic or acoustic waves transported by the MIM structures into the substrate. In one embodiment, a nonlinear material or sensor 882 may be inserted into slit 881 of ring 880. For the deposition of materials on the lower surfaces of the films suspended over the cavities defining rings 880, 885, channels may be provided that provide fluidic access between rings 880, 885 and a source of a CVD precursor gas.

Figure 9A:
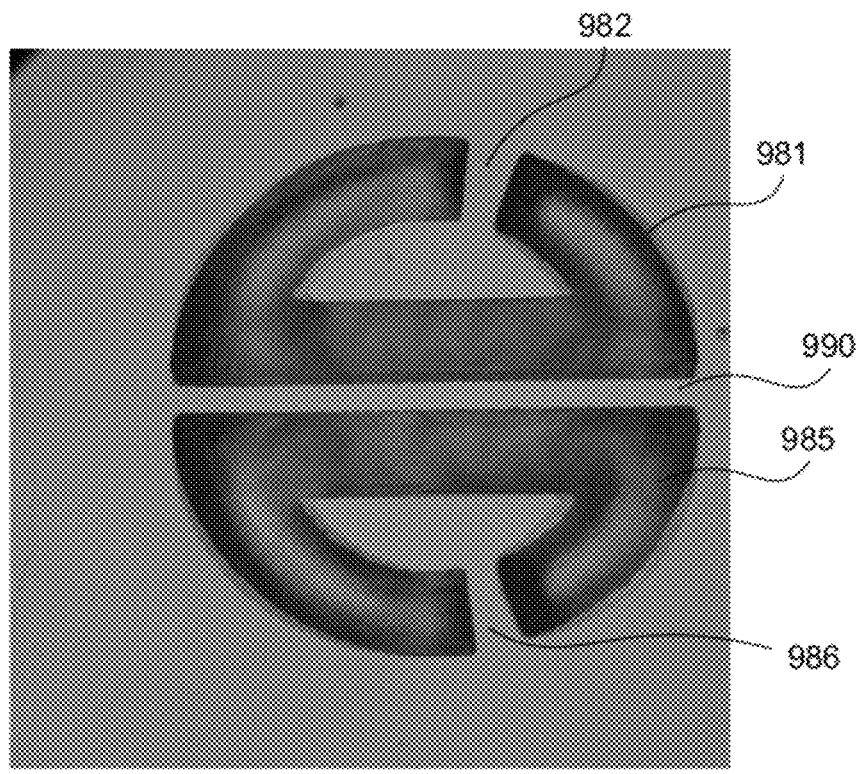
FIG. 9A-9B are SEM images of alternative structures formed using LACE and/or LA-CVD, according to one example.
Figure 9B:
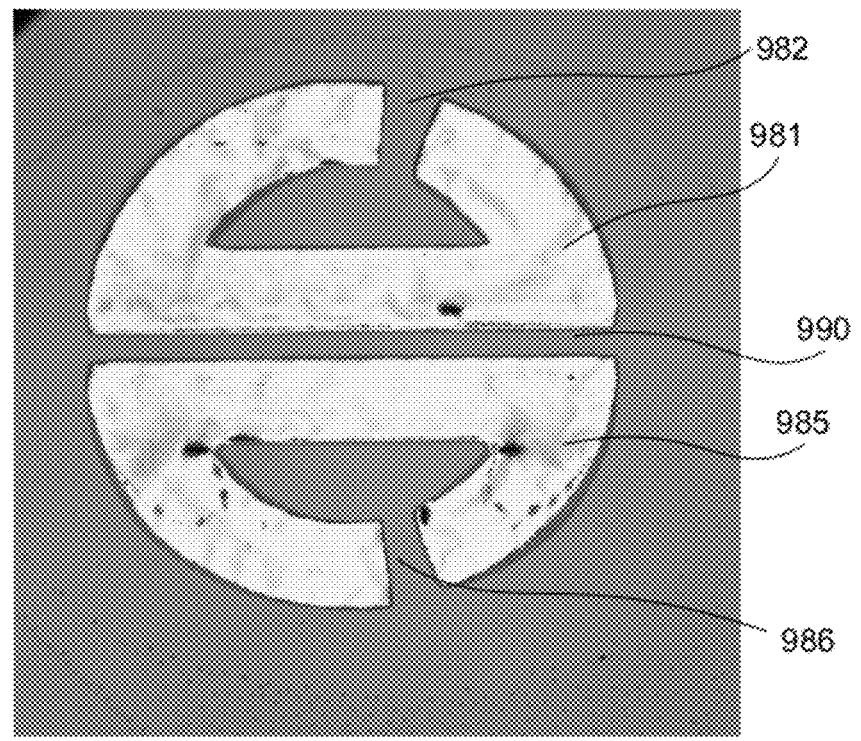

FIGS. 9A and 9B are optical microscope images of exemplary SRRs prepared according to one embodiment of the present invention and having a similar layout to that illustrated in FIG. 8B. The SRRs of FIGS. 9A-9B were prepared by first performing LACE as described above with respect to FIG. 5 on an $SiO_2$ film having a thickness of approximately 140 nm disposed on an Si wafer, in accordance with the pattern of FIG. 8B. The LACE processing created a pair of patterned cavities under the $SiO_2$ film. As can be seen in FIG. 9A, first cavity 981 is in the shape of a "D" having slit 982, and second cavity 985 is also in the shape of a "D" having slit 986. Rings 981, 985 are separated by spacing 990. In FIG. 9A, LA-CVD has not yet been performed, so rings 981, 985 constitute ring-shaped cavities over which corresponding portions of an $SiO_2$ film are suspended. FIG. 9B is an SEM image of the structure of FIG. 9A following platinum deposition using LA-CVD on the upper surface of the suspended $SiO_2$ film as described above with respect to FIG. 5. Here, the lower surface of $SiO_2$ film was not exposed to the CVD precursor gas, and so the platinum was not deposited on that surface. Rings 981 and 985 shown in FIG. 9B appear significantly brighter than do the corresponding rings shown in FIG. 9A because platinum is a better reflector than $SiO_2$. It may also be observed from FIG. 9B that platinum was deposited substantially only at rings 981, 985, and not on the surrounding substrate or non-suspended portions of the $SiO_2$ film.

Figure 10A:
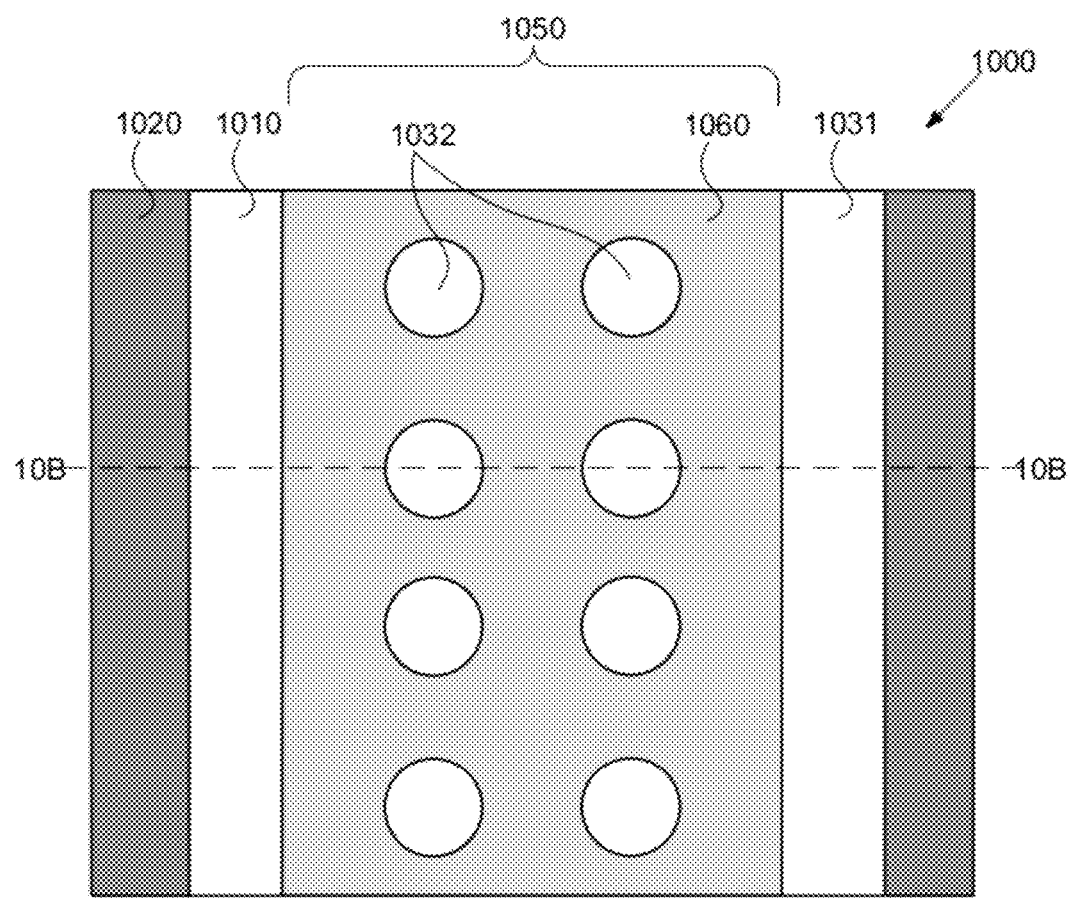
FIGS. 10A-10B respectively schematically illustrate plan and cross-sectional views of an alternative structure formed using LA-CVD, according to some embodiments.
Figure 10B:
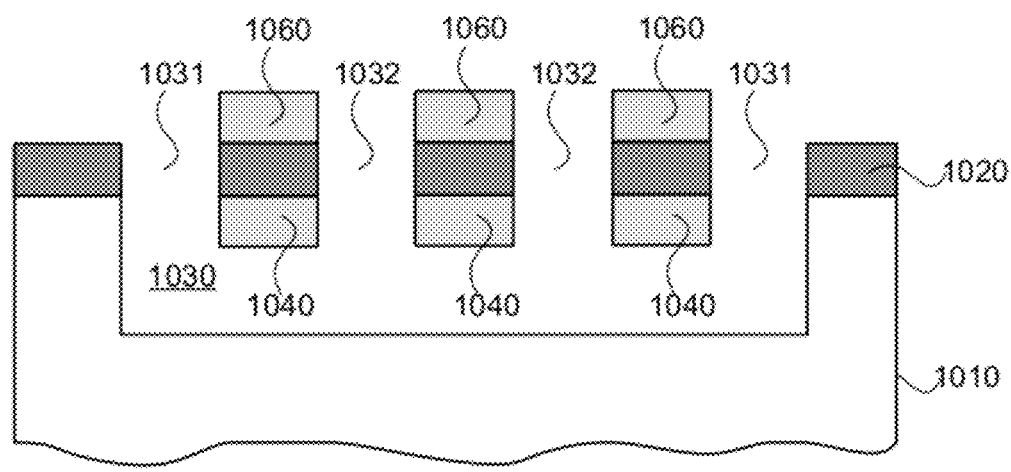

FIGS. 10A and 10B respectively illustrate plan and cross-sectional views of another photonic/acoustic/plasmonic structure 1000 that may be constructed according to certain embodiments of the present invention. Structure 1000 includes substrate 1010, film 1020 disposed on the upper surface of substrate 1010, first material layer 1040 disposed on a lower surface of film 1020, and second material layer 1060 disposed on an upper surface of film 1020. Film 1020 is suspended over cavity 1030. In one embodiment, substrate 1010 is a semiconductor, film 1020 is an insulator, and films 1040, 1060 are metals. Film 1020 is patterned to define a plurality of apertures 1031, 1032 extending therethrough in specified regions that expose the underlying substrate 1010. Specifically, apertures 1031 define a central region 1050, while apertures 1032 define a plurality of periodically spaced holes within that region. Apertures 1031, together with cavity 1030, serve to isolate the structures within central region 1050 from substrate 1010, creating a highly efficient waveguide with little coupling to the substrate. Apertures 1032 serve to modify the band structure of structure 1040, 1020, 1060, e.g., by allowing the structure only to support photons, phonons, or plasmons of specified frequency. As will be appreciated, the refractive indeces, acoustic impedances, film thicknesses, aperture spacings, and aperture dimensions may suitably be selected for structures to be used with photons, phonons, or plasmons of desired wavelength(s). In one example, the parameters of structure 1000 are selected such that assembly 1020/1040/1060 supports optical waves of desired wavelength(s), and apertures 1032 impose an optical bandgap for optical waves of other desired wavelength(s). In another example, the parameters of structure 1000 are selected such that assembly 1020/1040/1060 supports plasmons of desired wavelength(s), and apertures 1032 impose a plasmonic bandgap for plasmons of other desired wavelength(s). In yet another example, the parameters of structure 1000 are selected such that assembly 1020/1040/1060 supports acoustic waves of desired wavelength(s), and apertures 1032 impose an acoustic bandgap for acoustic waves of other desired wavelength(s). Generally, composite structures provided herein, such as illustrated in FIGS. 10A-10B, are not limited to use with a single wavelength range, or even a single type of wave.

The structure illustrated in FIGS. 10A and 10B may be formed using methods described above with respect to FIG. 5. Specifically, film 1020 may be formed using ion implantation (step 533) in accordance with a pattern. For example oxygen ions may be implanted into an Si wafer in accordance with the pattern shown in FIGS. 10A-10B using direct-write patterning, or by providing a patterned mask prior to ion implantation. Cavity 1030 and apertures 1031, 1032 may then be prepared using LACE (step 540) by etching out portions of the substrate surrounding patterned layer 1020. Metal layers 1040, 1060 may then be deposited on patterned layer 1020 using LA-CVD (step 550) as described above.

Embodiments in which film 1020 is an insulator and material layers 1040, 1060 are metal may potentially be used in a variety of suitable devices, such as a photonic device, e.g., a communication waveguide or multi-channel plate. In other embodiments, film 1020 is a material with a piezoelectric, thermal, or electrostrictive response and material layers 1040, 1060 are metal or other conductors configured to apply a voltage across film 1020 (e.g., through the thickness of film 1020, or laterally across the surface of film 1020, or both). Such devices may be used, for example, as a surface acoustic wave (SAW) device, acoustic metamaterial, or electromechanical device.

Figure 11:
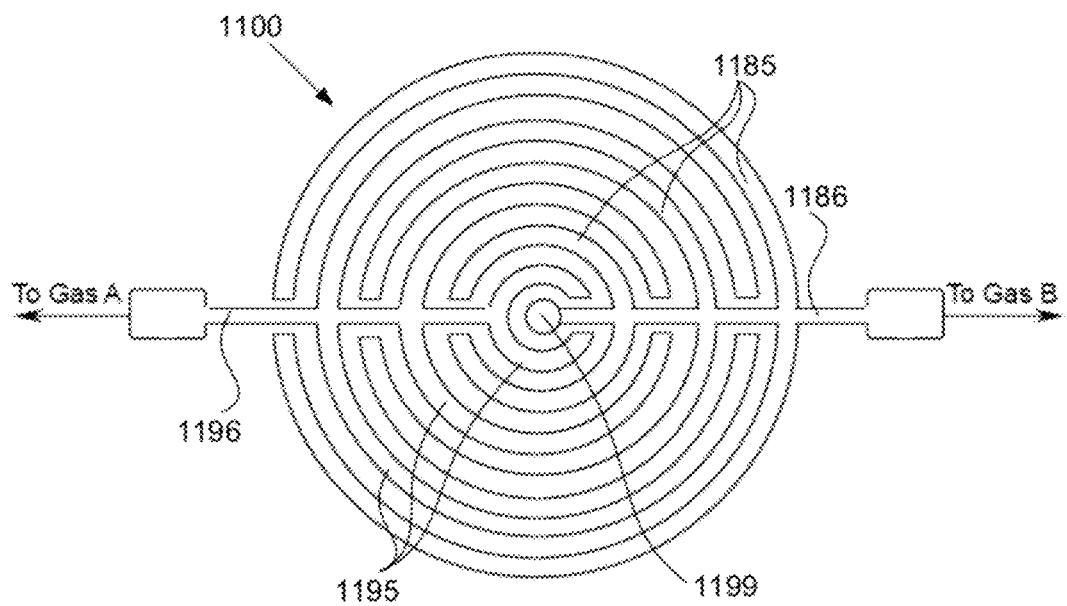
FIG. 11 schematically illustrates a plan view of an alternative structure formed using LA-CVD, according to some embodiments.

FIG. 11 schematically illustrates a plan view of an alternative structure 1100 that may be prepared using the methods described herein. Structure 1100 includes first and second interdigitated ring structures 1185, 1195. First ring structure 1185 includes a first plurality of partial rings that are fluidically connected to first common channel 1186, which is fluidic communication with a first gas source "B", e.g., a source of a first fluidic CVD precursor. Second ring structure 1195 includes a second plurality of partial rings that are fluidically connected to a second common channel 1196, which is in fluidic communication with a second gas source "A", e.g., a source of a second fluidic CVD precursor that may be different from the first CVD precursor. First ring structure 1185, together with first common channel 1186, constitute a first patterned cavity defined in the substrate, over which a film portion is suspended; similarly, second ring structure 1195, together with second common channel 1196, constitute a second patterned cavity defined in the substrate, over which a different film portion is suspended. During LA-CVD, the first patterned cavity may be exposed to the first fludic CVD precursor, and the second patterned cavity may concurrently or sequentially be exposed to the second fluidic CVD precursor, so as to deposit different materials on the lower surfaces of the film portions that are suspended over those respective cavities. Note that the CVD precursors need not necessarily be different than one another, i.e., that the same materials may be deposited on the film portions that are respectively suspended over the first and second cavities. In embodiments in which the suspended film is an insulator and the material(s) deposited are metals, the resulting MIM structure may be useful as an acoustic or plasmonic device, for example, an antenna or sensor. Optionally, a nonlinear material 1199 may be provided in the high field region at the center of the rings. In one illustrative embodiment, the upper and/or lower surfaces of the film are coated with a chemical-specific coating, and the structure used as a sensor in which binding of the specified chemical to the coating causes a change in the optical, plasmonic, or acoustic characteristics of the device, thus facilitating detection of the chemical.

Figure 12A:
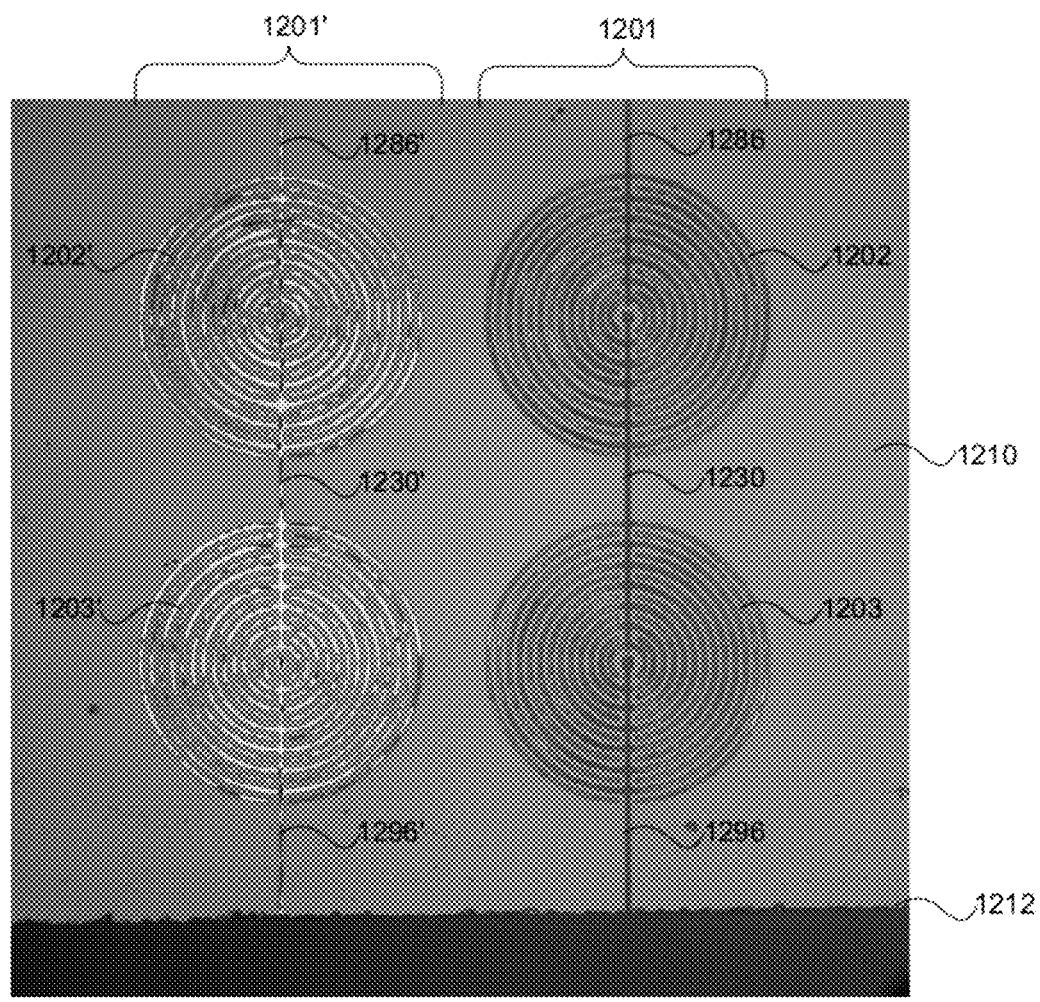
FIGS. 12A-12C are SEM images of alternative structures formed using LA-CVD, according to one example.
Figure 12B:
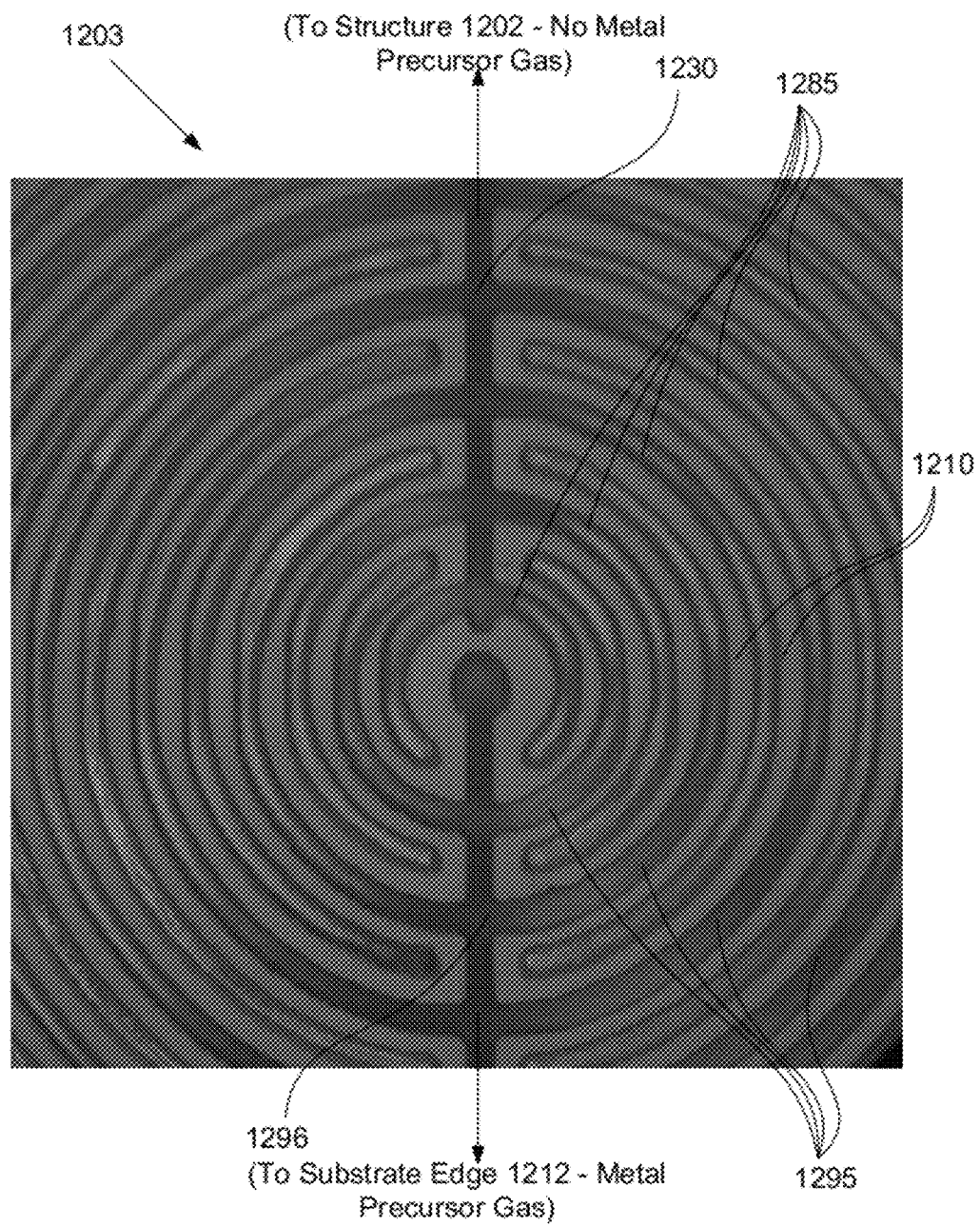
Figure 12C:
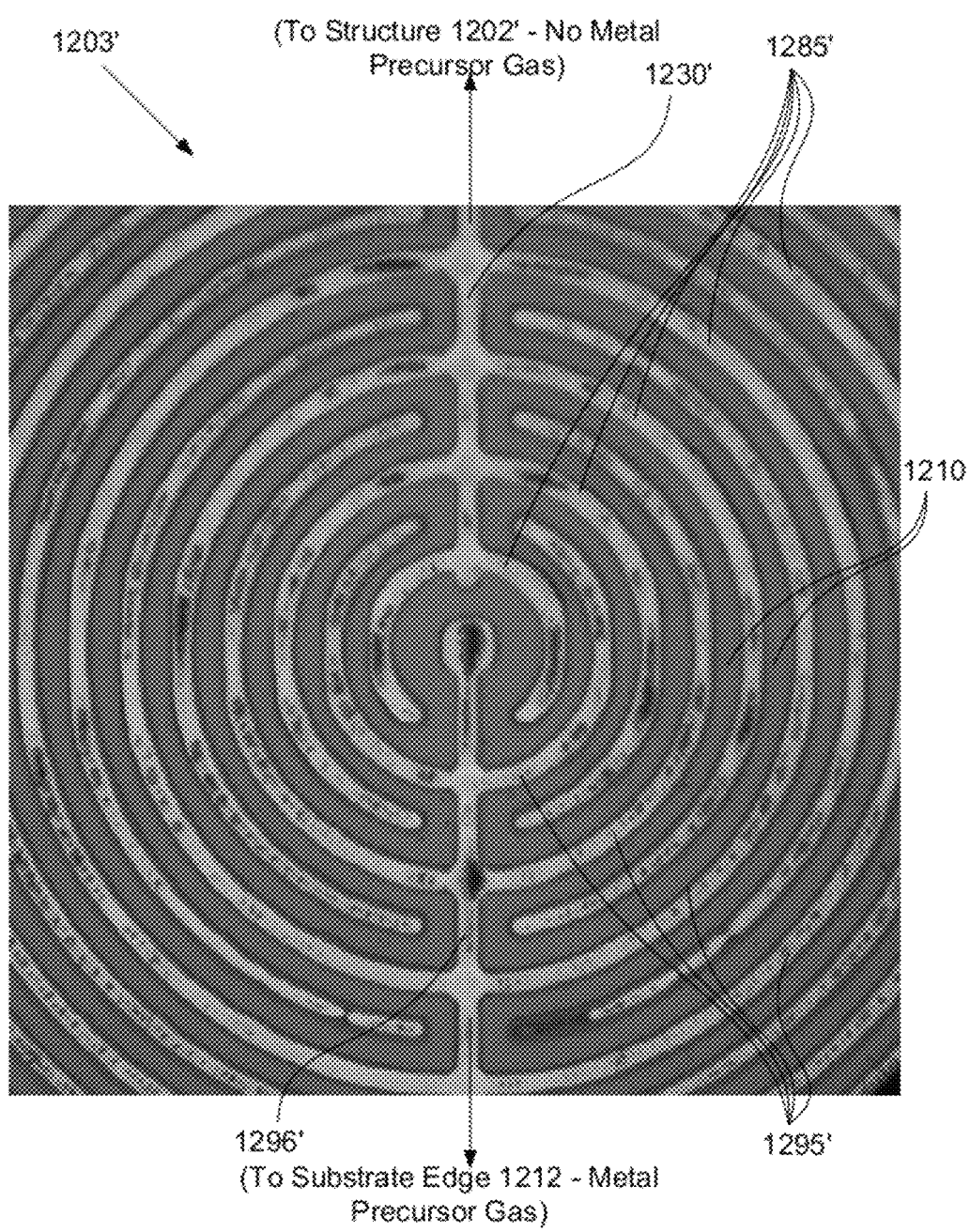

FIGS. 12A-12C are optical microscope images of exemplary structures 1202, 1203, 1202', 1203' defined in substrate 1210, and prepared according to one embodiment of the present invention. Structures 1202, 1203 are arranged in a first pair 1201, and structures 1202', 1203' are arranged in a second pair 1201'. Each of structures 1202, 1203, 1202', and 1203' has a layout similar to that illustrated in FIG. 11. For example, as illustrated in FIG. 12B, structure 1203 includes first and second interdigitated ring structures 1285, 1295. First ring structure 1285 includes a first plurality of partial rings that are separated from each other by portions of substrate 1210, and are fluidicially connected to first common channel 1230. Second ring structure 1295 includes a second plurality of partial rings that are separated from each other by portions of substrate 1210, and are fluidically connected to second common channel 1296. First ring structure 1285, together with first common channel 1230, constitute a first patterned cavity defined in substrate 1210, over which a first portion of an $SiO_2$ film having thickness of about 140 nm is suspended. Second ring structure 1295, together with second common channel 1296, constitute a second patterned cavity defined in substrate 1210, over which a second portion of the $SiO_2$ film is suspended. In this example, first common channel 1230 terminates within structure 1202, as can be seen in FIG. 12A, and thus is not in fluidic communication with a source of fluidic CVD precursor. Second common channel 1296 is in fluidic communication with the edge 1212 of substrate 1210, and thus is in fluidic communication with any fluid to which substrate 1210 is exposed. As such, if substrate 1210 is exposed to a fluid, the fluid may flow underneath the portion of the $SiO_2$ film suspended over the cavity defined by second common channel 1296 and second ring structure 1203.

As shown in FIG. 12C, structure 1203' is configured similarly to structure 1203. Specifically, structure 1203' includes first and second interdigitated ring structures 1285', 1295'. First ring structure 1285' includes a first plurality of partial rings that are fluidicially connected to first common channel 1230', and second ring structure 1295' includes a second plurality of partial rings that are fluidically connected to second common channel 1296'. First common channel 1230' terminates within structure 1202', and thus is not in fluidic communication with a source of fluidic CVD precursor, while second common channel 1296' is in fluidic communication with the edge 1212 of substrate 1210, and thus is in fluidic communication with any fluid to which substrate 1210 is exposed.

As shown in FIG. 12A, structures 1202, 1202' are similarly configured to structures 1203, 1203', in that they each also include first (upper) and second (lower) pluralities of interdigitated partial rings. However, for each of structures 1202, 1202', the first (upper) plurality of partial rings is in respective fluidic communication with a third common channel 1286, 1286', while the second (lower) plurality of partial rings is in respective fluidic communication with the first common channel 1230, 1230' already described above with reference to FIGS. 12B and 12C. In this example, third common channels 1286, 1286' each are in fluidic communication with the upper edge of substrate 1210 (not shown in FIG. 12A), and thus are in fluidic communication with any fluid to which substrate 1210 is exposed. However, because the first common channel 1230, 1230' respectively terminates within structures 1203, 1203', the second (lower) plurality of partial rings for structures 1202, 1202' is not in fluidic communication with a CVD precursor fluid.

As can be seen in FIGS. 12A-12C, the first pair 1201 of structures 1202, 1203 has a markedly different appearance from the second pair 1201' of structures 1202', 1203'. This is a result of different processing steps performed on the different pairs, as will now be described. Specifically, the first and second pairs of structures, 1201, 1201' were prepared by first providing an $SiO_2$ film having a thickness of approximately 140 nm disposed on an Si wafer 1210. Then, LACE was performed as described above with respect to FIG. 5, in accordance with the pattern of FIG. 11. The pattern of laser irradiation used during the LACE processing was selected to create two pairs of patterned cavities under the $SiO_2$ film, the first pair designated 1201, and the second pair designated 1201', having the configuration described in greater detail above. The beam waist of the laser was between about 2 and 5 µm, resulting in a line spacing of approximately 7.5 µm, and each of structures 1202, 1202', 1203, 1203' having a radius of approximately 100 µm.

Following LACE, platinum was deposited on the second pair of patterned cavities 1201' using LA-CVD, but was not deposited on the first pair 1201. During LA-CVD, the entire substrate 1210 was exposed to tetrakis(trifluorophosphine) platinum gas (Strem Chemicals, Inc., Newburyport, Mass.) at a pressure of approximately 1 torr. The second pair of patterned cavities 1201' was irradiated with multiple passes of light from an argon-ion laser, which was significantly attenuated below the 10 mW level used in the above-provided examples, and focused to a beam waist of approximately 2 to 5 µm. However, the pattern of laser irradiation was not the same as was used to fabricate the cavities, i.e., the pattern of laser irradiation did not follow the specific pattern of the cavities. Instead, the laser beam was attenuated and rastered 6-8 times over substrate 1210 in a rectangular pattern that overlapped the region occupied by the second pair of structures 1201', and that did not overlap the region occupied by the first pair of structures 1201. As a result, platinum was deposited on pair 1201', but not on pair 1201, resulting in the brighter appearance of pair 1201' owing to the significantly higher reflectivity of platinum than $SiO_2$. The apparent intensity variations of the $SiO_2$ layer, as seen in FIG. 12B, and of the metal, as seen in FIG. 12C, were attributed to reflectivity variations caused by slight mechanical buckling of the respective $SiO_2$ or metal layer.

Within pair 1201', platinum was deposited on upper surface of the $SiO_2$ film suspended over the cavities defining structures 1202' and 1203'. However, as noted above, only selected portions of structures 1202' and 1203' were in fluidic communication with the precursor gas via common channels 1286', and 1296' extending to the edges of substrate 1210, while other portions of structures 1202' and 1203' were not in fluidic communication with the precursor gas because common channel 1230' extends only between structures 1202' and 1203'. In the portions of structures 1202' and 1203' in fluidic communication with the precursor gas, platinum was deposited on both the upper and lower surface of the $SiO_2$ film. However, in the portions of structures 1202' and 1203' that were not in fluidic communication with the precursor gas, platinum was deposited only on the upper surface of the $SiO_2$ film, because there was substantially no pathway for the precursor to access the lower surface of the film.

Notably, even though the entire region shown in FIG. 12C was exposed to both the precursor gas and the rastered laser beam, platinum was substantially only deposited within regions at which LACE had been previously used to define cavities within substrate 1210, e.g., at ring structures 1285', 1295' and common channels 1230' and 1296', and was not deposited on portions of the substrate 1210 where there was no cavity defined. This would suggest that the substrate 1210 dissipated the heat deposited by the laser beam sufficiently well that the temperature in regions without cavities did not reach a level at which the precursor gas would react, while the heat deposited in the $SiO_2$ film portions suspended over the cavities built up to a temperature at which the precursor gas reacted, resulting in the selective deposition of platinum on those film portions. Such deposition does not appear to extend significantly, or at all, onto the portions of the substrate bordering the cavities, but appears to be confined solely to regions defined by the cavities. The spacing between features (e.g., between the first lateral edge of one ring structure 1285' and the analogous first lateral edge of its adjacent neighbor) in the illustrated example is about 7.5 μm, and was produced using a laser spot size of about 2-5 μm. By comparison, using FIB metal deposition writing conductor lines to apply a voltage may be expected to write, for example, a 50 nm line of platinum with a "top-hat" cross section (that is, a height that is of about the same order as the thickness). However, attempts to go above that thickness may result in scattering effects that make the cross-section of the metal deposition to appear more Gaussian. This FIB overspray may reduce resistance between adjacent metal lines, which may become problematic if those lines are to be used as conductors. Similar problems are associated with electron beam deposition of metals, although the problems scale differently. The LACE/LA-CVD methods provided herein may provide a path to writing conductive lines relatively close to one another, but without overspray and the concomitant reduced resistance associated with FIB or electron beam deposition. In particular, the LACE process may be associated with a relatively high temperature threshold, e.g., the melting point of silicon, which defines the cavity size, while the LA-CVD process may have a lower threshold with significantly different thermal parameters, e.g., defined by the cavity. Thus, controlling the features of the cavity facilitates controlling the dimensions of the materials deposited on the film portion suspended over that cavity.

Figure 13A:
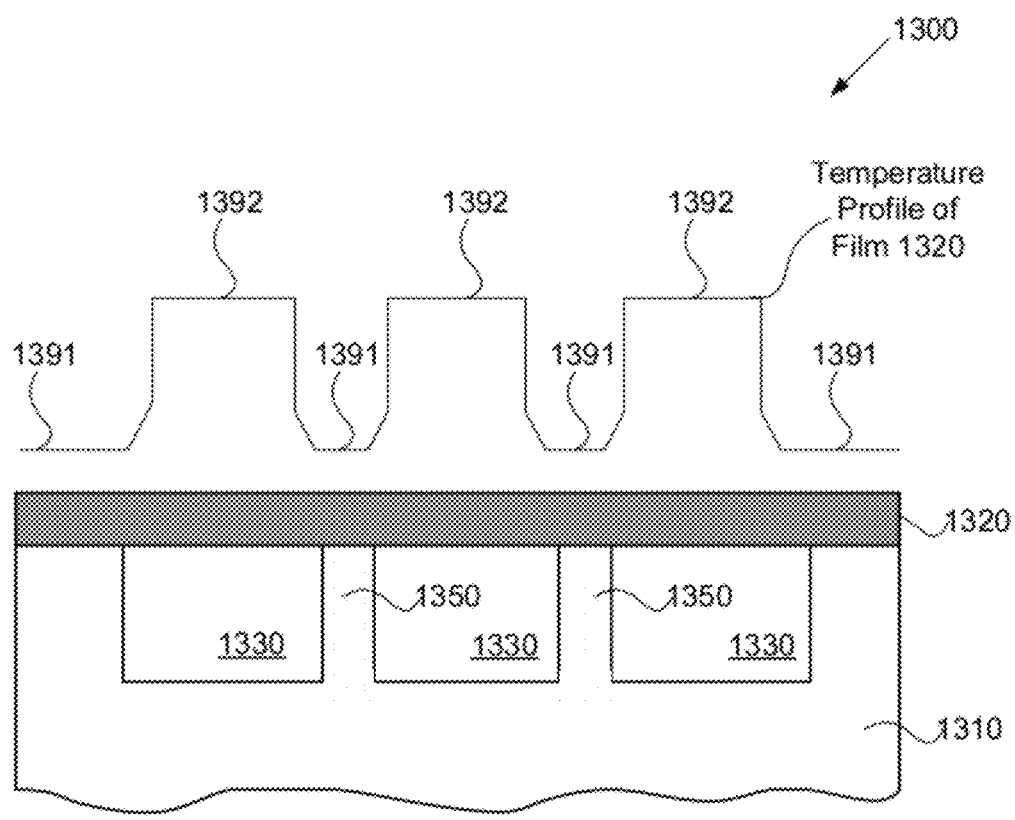
FIGS. 13A-13D schematically illustrate cross-sectional views of alternative structures formed using alternating LA-CVD and LACE processing, according to some embodiments.
Figure 13B:
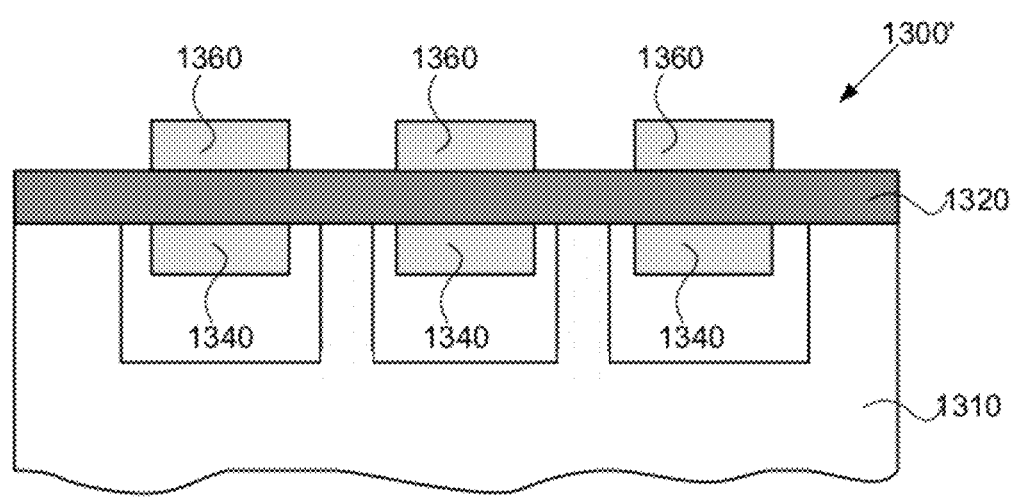
Figure 13C:
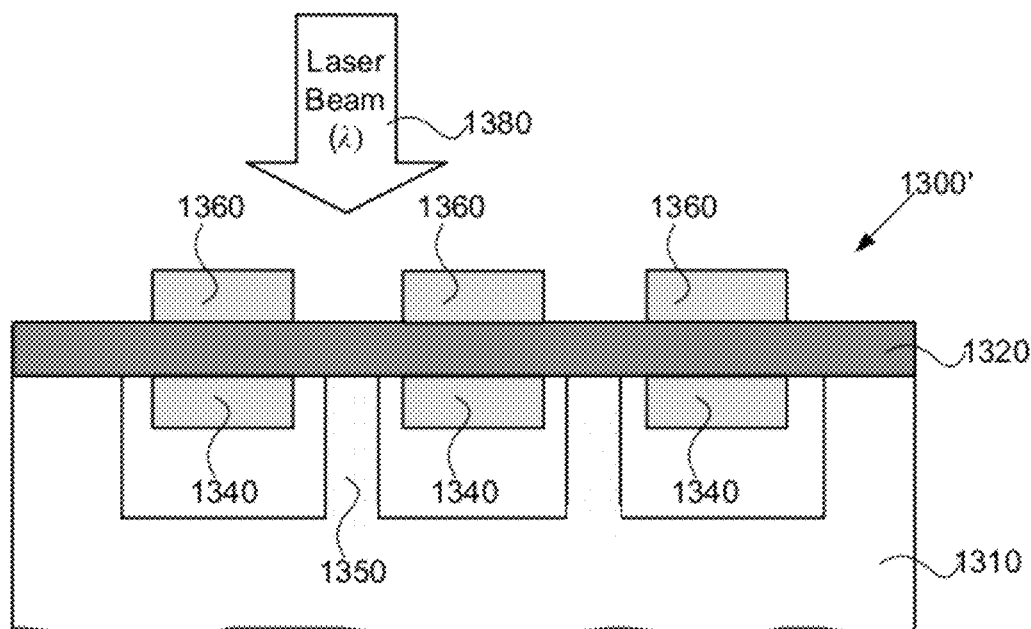
Figure 13D:
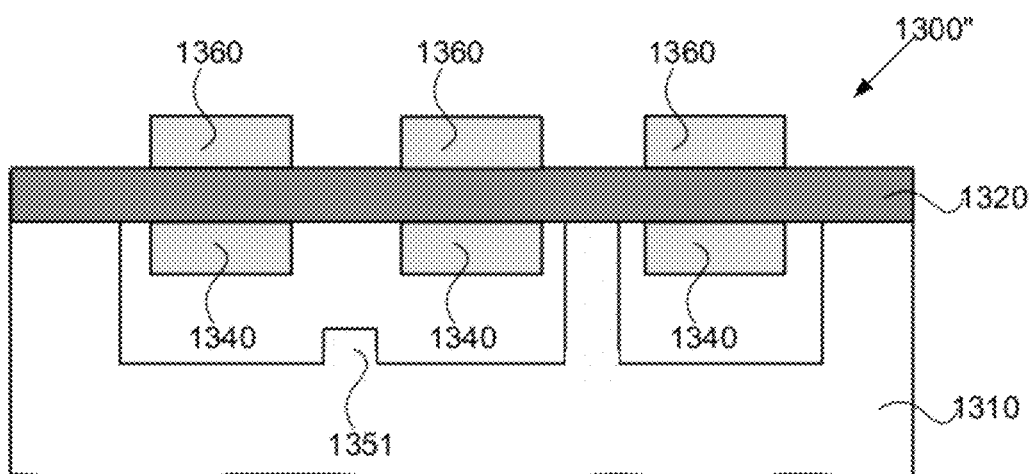

Different types of structures, and different combinations of LACE and LA-CVD processing, may be provided to further control the deposition of materials on films suspended over cavities. For example, FIGS. 13A-13D illustrate a structure 1300 in which a plurality of cavities 1330 are defined within substrate 1310, e.g., using LACE processing. Film 1320 is disposed on the upper surface of substrate 1310 and suspended over cavities 1330. A plurality of support columns 1350 separate cavities 1330 from one another. As illustrated in FIG. 13A, irradiation of structure 1300 with a laser beam (not illustrated) causes a temperature increase in suspended film regions 1392 as compared to non-suspended film regions 1391. FIG. 13B illustrates structure 1300' resulting from LA-CVD processing performed on structure 1300, in which material layers 1340 and 1360 are deposited on opposite sides of each suspended portion of film 1320. Structure 1300' may be further processed using LACE, for example as illustrated in FIG. 13C. Specifically, structure 1300' may be exposed to a suitable chemical etchant and to laser beam 1380, which may be directed toward a portion of substrate 1310 underlying film 1320. In the illustrated embodiment, laser beam 1380 is directed toward a first support column 1350. As shown in FIG. 13D, that support column 1350 may be substantially removed using LACE processing, a residual portion 1351 being shown. As such, by performing a LACE/LA-CVD/LACE sequence, multiple areas of patterned materials may be provided on a single suspended film, without the need for interposing support columns.

Embodiments in which film 1320 is an insulator and material layers 1340, 1360 are metal may potentially be used in a variety of suitable devices, such as a photonic, acoustic, or plasmonic antenna structure, grating, or waveguide. In particular, an acoustic or electromechanical structure may be formed by selecting film 1320 to include a piezoelectric material, e.g., to itself be piezoelectric or to be a multilayered film having at least one layer of piezoelectric material disposed therein, and material layers 1340, 1360 to be metals or other conductors suitable for applying a voltage across film 1320, e.g., through the thickness of film 1320 or laterally across film 1320.

Additionally, in an alternative embodiment, the cavity defined in substrate 1310 illustrated in FIGS. 13C and 13D may be filled with a precursor material, such as a liquid precursor for a piezoelectric, electrostrictive, or thermally responsive material, and the precursor subsequently reacted to form a solid material within the cavity. The material then may be actuated using conductive material layers 1360, or a response of the material may be detected via a voltage generated on material layers 1360. In another example, ion implantation may be used in combination with the LA-CVD deposition provided herein to create a material having a piezoelectric, electrostrictive, thermal, or other mechanical response.

Figure 14A:
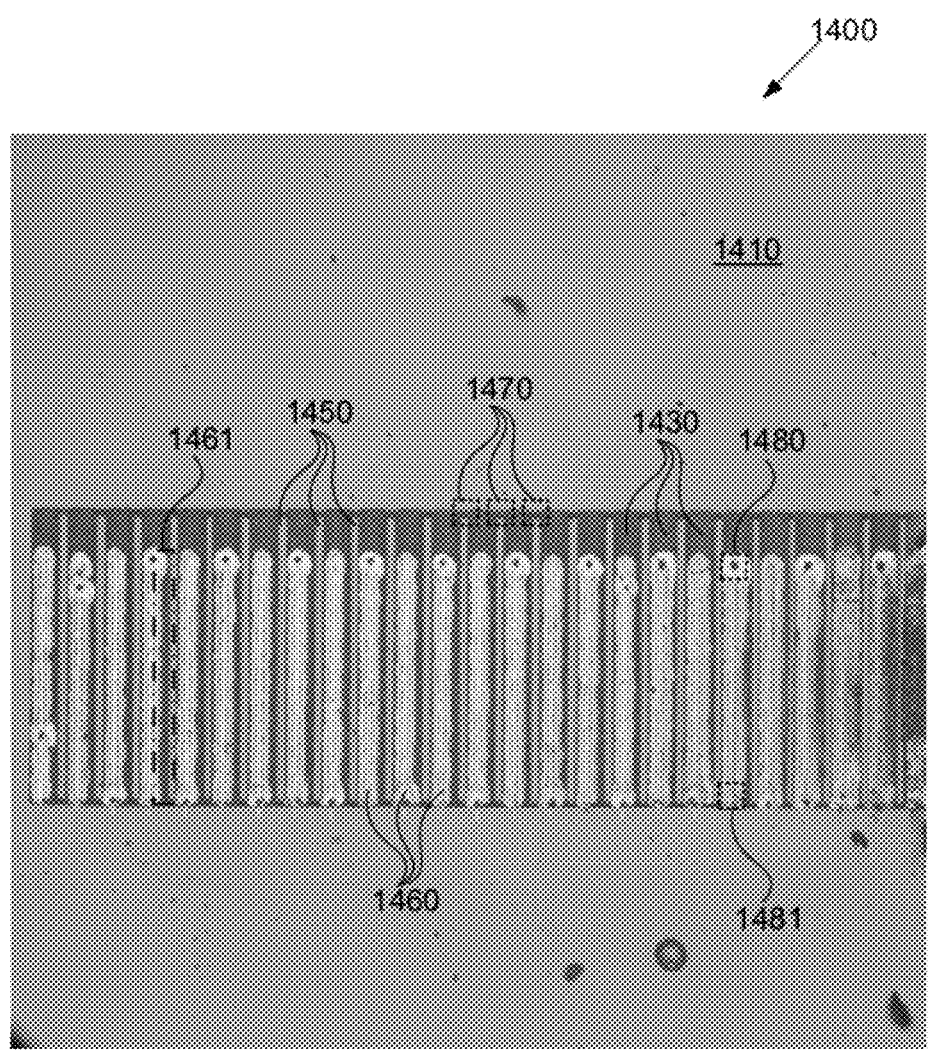
FIGS. 14A-14C are SEM images of alternative structures formed using alternating LA-CVD and LACE processing, according to one example.

FIG. 14A is an SEM image of a structure 1400 analogous to structure 1300' illustrated in FIG. 13B. Structure 1400 includes substrate 1410, upon which an $SiO_2$ film 1420 about 140 nm thick was deposited. A plurality of cavities 1430 were defined using LACE processing as described above, and separated by support columns 1450 that support the $SiO_2$ film. A plurality of gaps were provided between support columns 1450, e.g., in regions designated 1470, to provide fluidic communication between cavities 1430 for use in LACE and LA-CVD. LA-CVD was performed as described above to deposit platinum above the $SiO_2$ film in regions 1460 and below the $SiO_2$ film (not visible in FIG. 14A). Unlike the structures described above with reference to FIGS. 12A-12C, here the laser beam was not rastered over the entire cavity region during LA-CVD, but instead generally followed the pattern of the cavities. For example, region 1480 corresponds to a start position of the laser beam before the laser beam traced along the respective cavity, to a stop position at region 1481. The metal was selectively deposited on the suspended portion of the $SiO_2$ film, and not on the portion of the film disposed on the adjacent support column 1450, for example as evidenced by the dark gap within region 1461.

Figure 14B:
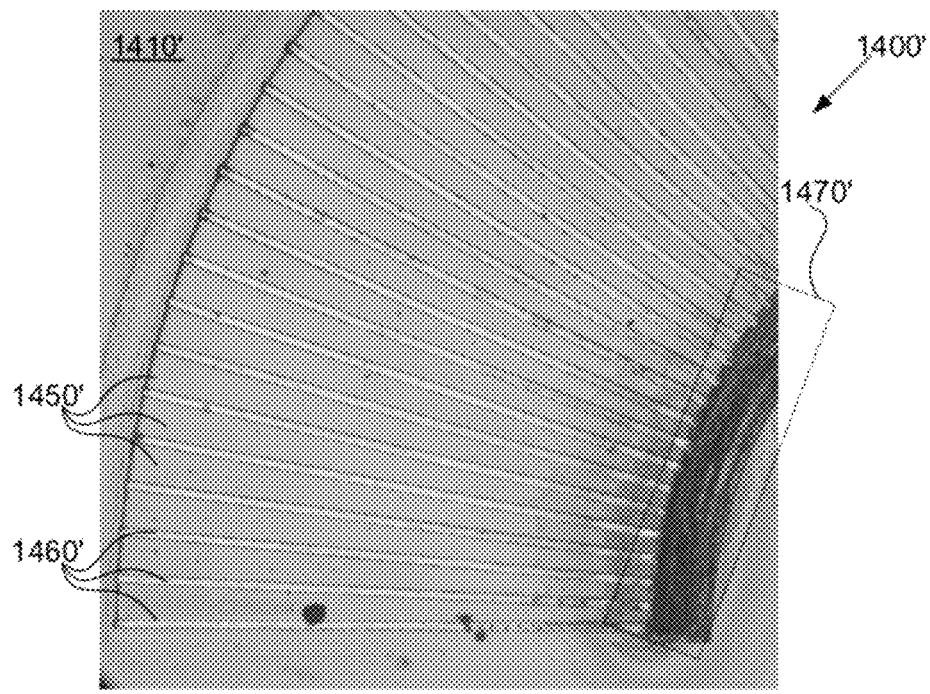
Figure 14C:
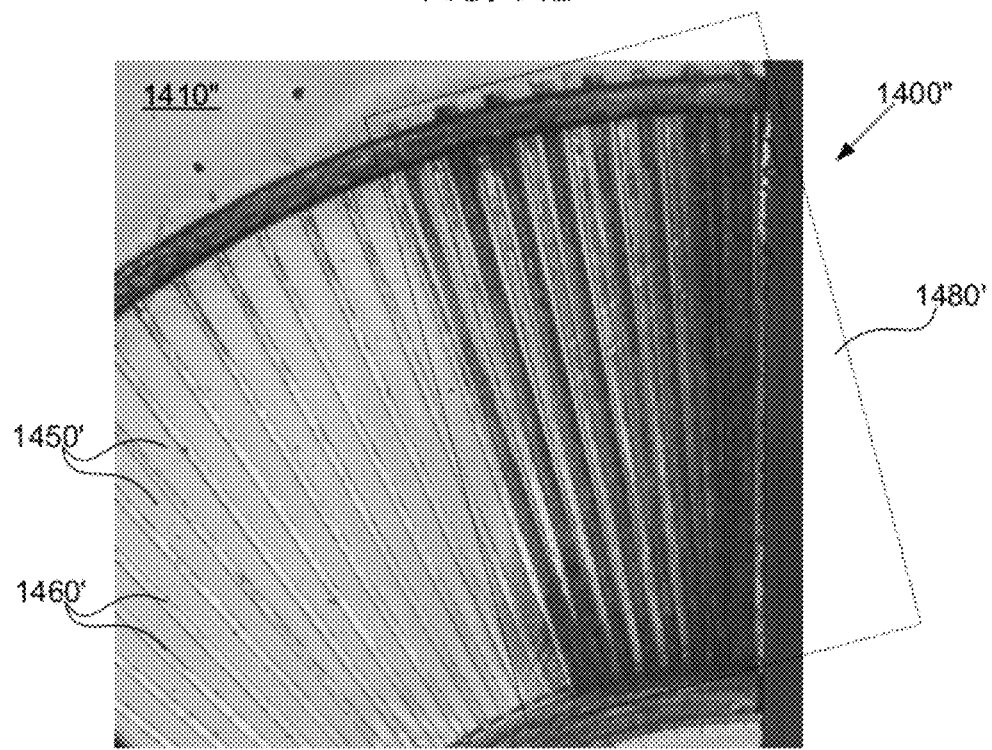

FIG. 14B is an SEM image of a structure 1400' that is analogous to that of FIG. 14A, but in which the overall pattern is slightly curved. Structure 1400' includes substrate 1410', upon which an $SiO_2$ film 1420' about 140 nm thick was deposited. A plurality of cavities (not visible in FIG. 14B) were defined using LACE processing as described above, and separated by support columns 1450' that support the $SiO_2$ film. A single large gap was provided in the region designated 1470', to provide fluidic communication between the cavities for use in LACE and LA-CVD. LA-CVD was performed as described above to deposit platinum above the $SiO_2$ film in regions 1460' and below the $SiO_2$ film (not visible in FIG. 14B). Then, as illustrated in FIG. 14C, structure 1400' was again subjected to LACE processing to remove the support columns 1450' within the region designated 1480', thus partially freeing the $SiO_2$ film, with multiple metal lines deposited thereon, from modified substrate 1410''.

Figure 14D:
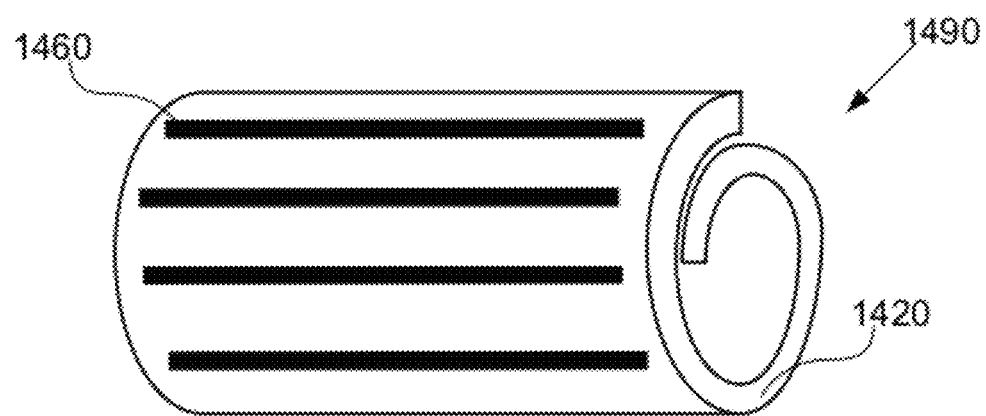
FIGS. 14D-14E schematically illustrate perspective views of structures that may be formed using alternating LA-CVD and LACE processing, according to some embodiments.
Figure 14E:
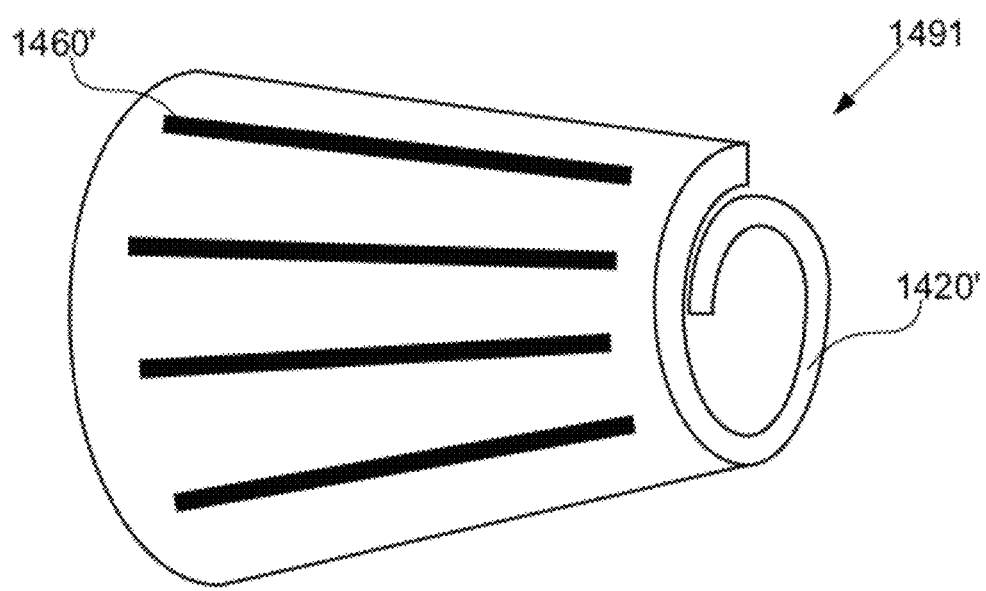

Alternating use of LACE and LA-CVD may thus be used to prepare complicated structures that are suitable for use in a variety of applications. For example, FIG. 14D illustrates structure 1490 that may be prepared by performing LACE on structure 1400 illustrated in FIG. 14A so as to remove substantially all of the support columns 1450 from beneath the $SiO_2$ film 1420 and thus free the film, with metal lines 1460 (and lines on the opposite side of the film, not shown) deposited thereon, from substrate 1410. FIG. 14E illustrates analogous structure 1491 that may be prepared by continuing to perform LACE on structure 1400'' illustrated in FIG. 14C so as to remove substantially all of the support columns 1450' from beneath the $SiO_2$ film 1420' and thus free the film, with metal lines 1460' (and lines on the opposite side of the film, not shown) deposited thereon, from substrate 1410''. Without wishing to be bound by any theory, it is believed that internal stress within structures 1490, 1491 may cause the $SiO_2$ films 1420, 1420'to curl up. Such curling may be facilitated by additional LA-CVD processing to deposit an additional material layer, such as metal or silicon nitride, that acts as a "glue" to hold the curled structure in place.

Such curling may alternatively, or additionally, be facilitated by preparing multilayer films in which different layers have different internal stress (tension or compression) properties. For example, as discussed above, $SiO_2$ formed by thermal growth tends to form films under compression, while $SiO_2$ formed by other methods may tend to be less compressed, and SiN tends to form films under tension. By providing a freestanding multilayer structure that includes layers having different tension/compressions than one another, for example, a layer of SiN over a layer of $SiO_2$, it is believed that the structure may preferentially curl to a desired degree.

Structures such as provided herein may find a variety of uses, among other things, as metamaterials. For example, one potential use of an array of structures 1490, 1491 illustrated in FIGS. 14D-14E is as a metamaterial, e.g., as a "Swiss roll" structure proposed by John Pendry, which has a negative magnetic permeability over a defined range of frequencies. For such an application, lines 1460 or 1460' may provide mechanical strength and facilitate directional curling of film 1420 or 1420'. The materials deposited onto film 1420 or 1420' may be selected to enhance the performance of the Swiss roll structure for its intended purpose. Optionally, a material is only deposited on one side of film 1420 or 1420'.

Figure 15A:
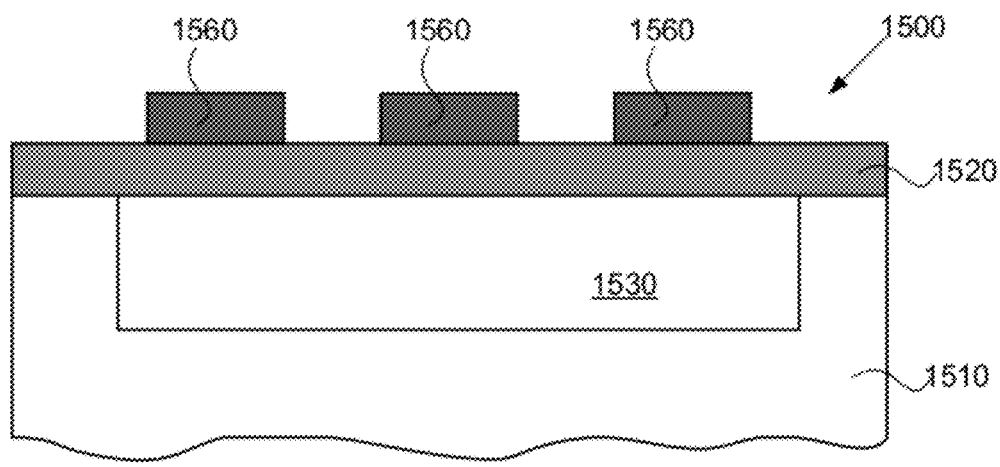
FIGS. 15A-15C schematically illustrate cross-sectional views of alternative structures that may be formed using LA-CVD, according to some embodiments.
Figure 15B:
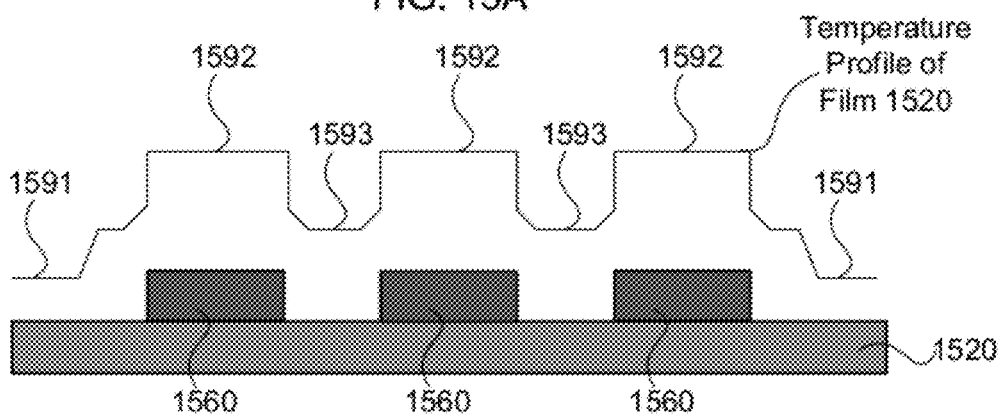
Figure 15C:
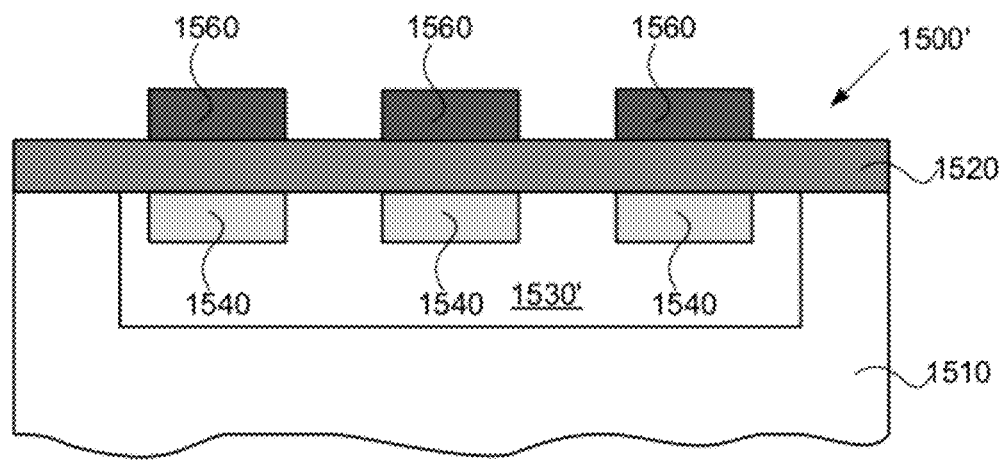

FIGS. 15A-15C schematically illustrate alternative structures that may be formed using LA-CVD. As shown in FIG. 15A, a structure 1500 may be provided that includes film 1520 suspended over cavity 1530 defined in substrate 1510. A plurality of optical absorbers 1560 are disposed on the upper surface of film 1560, for example, using prior art material deposition techniques, e.g., FIB deposition, colloidal deposition, or photolithography. As illustrated in FIG. 15B, structure 1500 may then be exposed to a laser beam (not illustrated), which generates a temperature profile having high temperature regions 1592 resulting from optical absorption of the laser light by absorbers 1560. The temperature profile also includes lower temperature regions 1593 where there is no absorber, but where film 1520 cannot readily dissipate heat because it is not in direct physical contact with substrate 1510. Regions 1591 correspond to portions of film 1520 that are disposed on substrate 1510 and thus readily dissipate heat, and therefore are at a lower temperature than regions 1592, 1593. Exposing structure 1500 to a fluidic CVD precursor concurrently with the laser beam results in deposition of material 1540 on the lower surface of film 1520, within high temperature regions 1592 defined by absorbers 1560, as shown for structure 1500' of FIG. 15C.

Figure 16A:
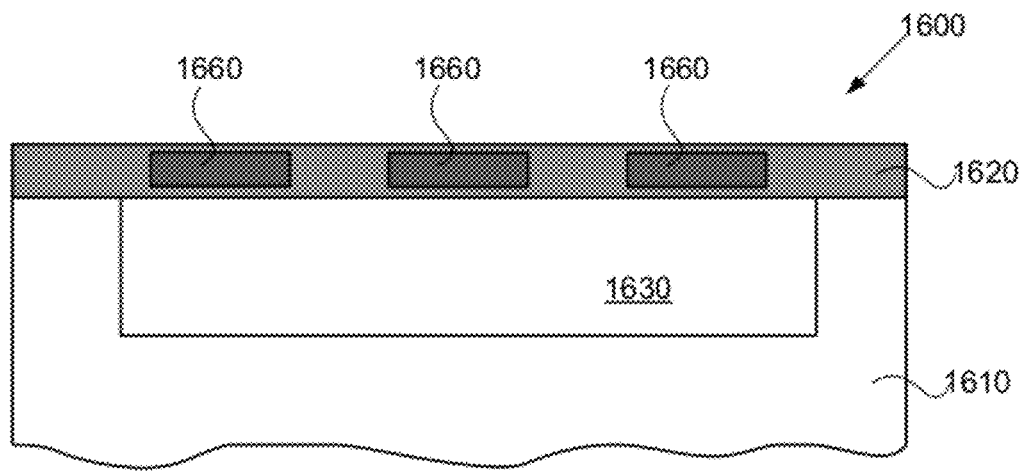
FIGS. 16A-16C schematically illustrate cross-sectional views of alternative structures that may be formed using LA-CVD, according to some embodiments.
Figure 16B:
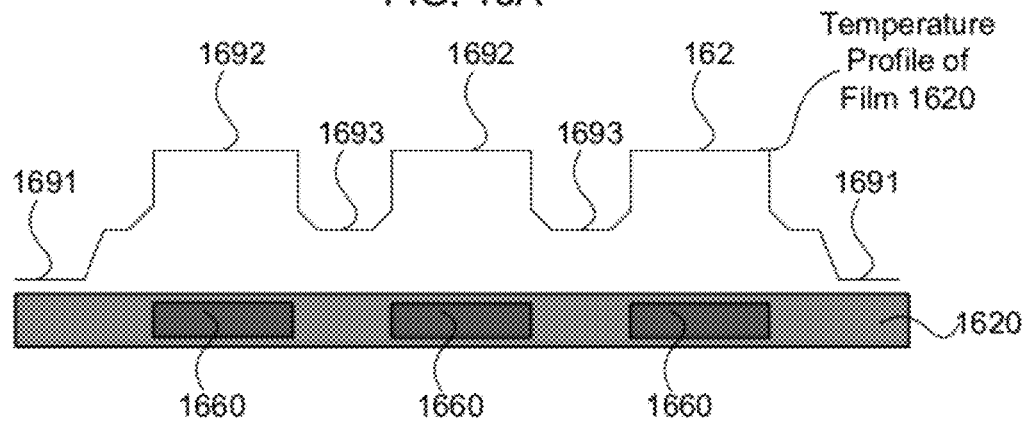

Note that alternatively, instead of disposing optical absorbers 1560 on top of film 1520, patterned ion implantation may be used, such as described in U.S. patent application Ser. No. 12/584,939, filed Sep. 14, 2009 and entitled "Systems and Methods for Preparing Films Using Sequential Ion Implantation, and Films Formed Using Same," the entire contents of which are incorporated by reference herein; or in U.S. patent application Ser. No. 13/049,762, filed Mar. 16, 2011 and entitled "Systems and Methods for Preparing Films Comprising Metal Using Sequential Ion Implantation, and Films Formed Using Same," the entire contents of which are incorporated herein by reference. For example, as illustrated in FIG. 16A, a structure 1600 may be provided that includes film 1620 suspended over cavity 1630 defined in substrate 1610. A plurality of optical absorbers 1660 are disposed within film 1620, for example, using patterned ion implantation. As illustrated in FIG. 16B, structure 1600 may then be exposed to a laser beam (not illustrated), which generates a temperature profile having high temperature regions 1692 resulting from optical absorption of the laser light by absorbers 1660. The temperature profile also includes lower temperature regions 1693 where there is no absorber, but where film 1620 cannot readily dissipate heat because it is not in direct physical contact with substrate 1610. Regions 1691 correspond to portions of film 1620 that are disposed on substrate 1610 and thus readily dissipate heat, and therefore are at a lower temperature than regions 1692, 1693. Exposing structure 1600 to a fluidic CVD precursor concurrently with the laser beam results in deposition of material 1640, 1650 on the lower and upper surfaces of film 1620, within high temperature regions 1692 defined by absorbers 1660, as shown for structure 1600' of FIG. 15C. Thus, both optical absorbers 1560 and 1660 are useful for providing a "handle" to facilitate the selective coupling of energy from the laser into films 1520 and 1620, respectively, so as to provide enhanced control over the deposition process. As noted above, if it is desired to deposit material on only one of the upper or lower surfaces, then only that surface is exposed to the fluidic CVD precursor during irradiation.

Figure 16C:
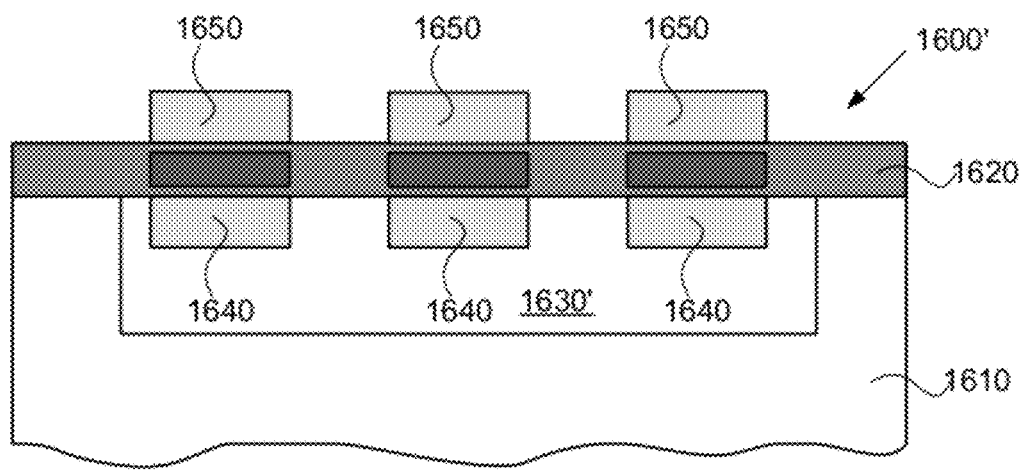

In some embodiments, structures such as structure 1600' illustrated in FIG. 16C may be used as a photonic or phononic structure or as a plasmonic or acoustic metamaterial structure. For example, if optical absorbers 1660 extend laterally through film 1620 (in the dimension out of the page) and have a refractive index or acoustic impedance that sufficiently contrasts with that of film 1620, then optical absorbers 1660 may act as waveguides for optical or acoustic energy. Material layers 1650, 1640 may act as cladding for those waveguides, improving containment of the optical or acoustic energy within optical absorbers 1660.

Figure 17A:
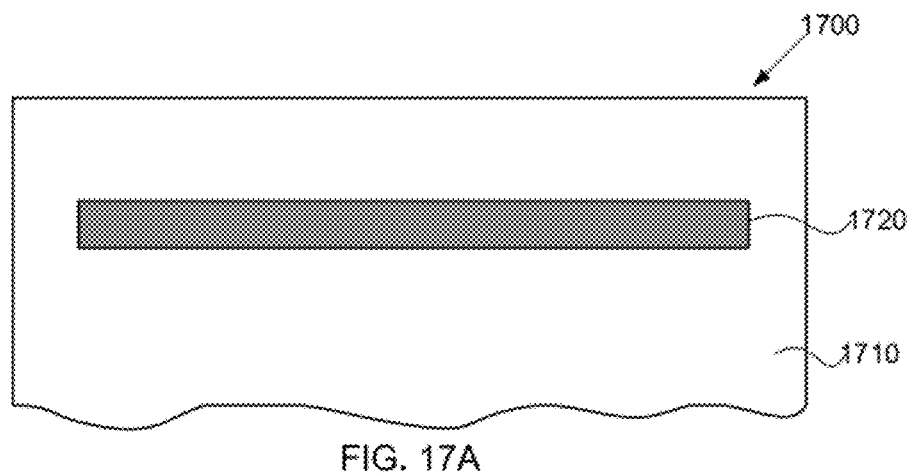
FIGS. 17A-17C schematically illustrate cross-sectional views of alternative structures that may be formed using LA-CVD, according to some embodiments.
Figure 17B:
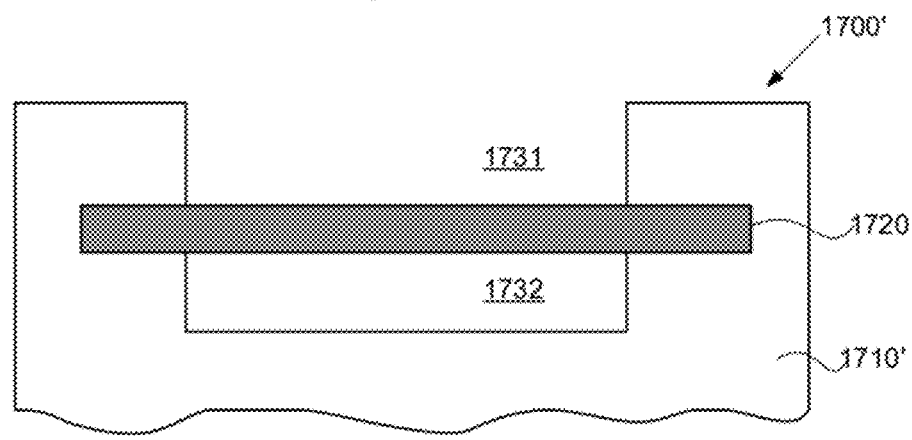
Figure 17C:
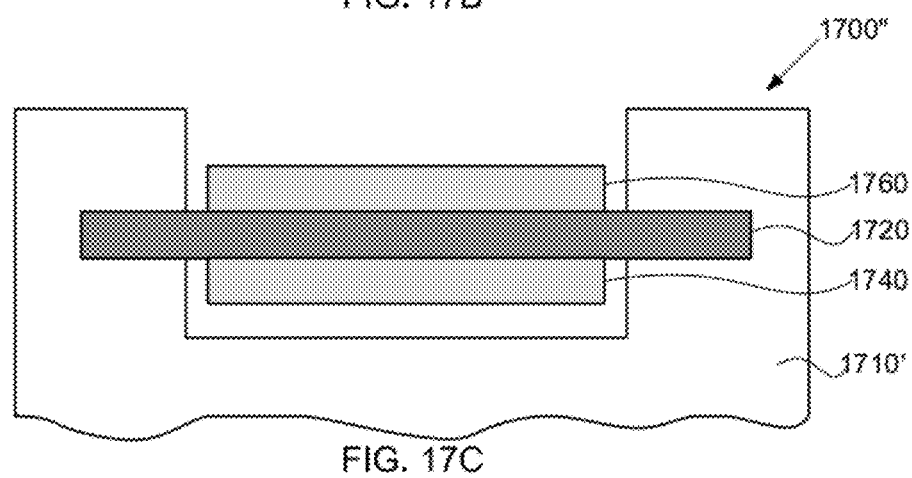

FIGS. 17A-17C schematically illustrate alternative structures that may be formed using LA-CVD. As shown in FIG. 17A, a structure 1700 may be provided that includes film 1720 embedded within substrate 1710. Such a structure may be prepared, for example, using ion implantation techniques such as described in U.S. patent application Ser. Nos. 12/584,939 or U.S. patent application Ser. No. 13/049,762. Any suitable prior art method of preparing embedded films may also be used.

As illustrated in FIG. 17B, cavities 1731 and 1732 may be defined in modified substrate 1710', respectively above and below film 1720, so that film 1720 is suspended over cavity 1732. LA-CVD may then be performed on the resulting structure 1700'. As shown in FIG. 17C, the resulting structure 1700" includes first and second material layers 1740, 1760 disposed on opposite sides of film 1720 from one another, both of which are disposed below the upper surface of the modified substrate 1710'.

While various illustrative embodiments of the invention are described above, it will be apparent to one skilled in the art that various changes and modifications may be made therein without departing from the invention. The appended claims are intended to cover all such changes and modifications that fall within the true spirit and scope of the invention.

What is claimed:

1. A method of preparing a structure, the method comprising:
   providing a film including first and second major film surfaces opposing one another and each suspended over and spanning a cavity defined in a substrate, the film being thin relative to the substrate;
   exposing the first major film surface to a first fluidic precursor;
   heating the first major film surface with a first laser light in the presence of the first fluidic precursor to a temperature sufficient to convert the first fluidic precursor to a first solid layer disposed on the first major film surface, the first major film surface defining an interface between the first solid layer and the film;
   exposing the second major film surface to a second fluidic precursor; and
   heating the second major film surface with the first laser light in the presence of the second fluidic precursor to a temperature sufficient to convert the second fluidic precursor to a second solid layer disposed on the second major film surface, the second major film surface defining an interface between the second solid layer and the film;
   wherein the film comprises an electrical insulator, wherein the first fluidic precursor comprises a first metalorganic compound, and wherein the first solid layer comprises a first metal, wherein the second fluidic precursor comprises a second metalorganic compound, and wherein the second solid layer comprises a second metal,
   wherein the first and second metals are selected independently from the group consisting of: platinum, gold, silver, tungsten, titanium, rhodium, iridium, iron, aluminum, cobalt, copper, and gallium.

2. The method of claim 1, wherein the first fluidic precursor comprises a gas.

3. The method of claim 1, wherein forming the cavity comprises:
   providing the substrate;
   affixing the film to the substrate;
   exposing the film and substrate to an etchant;
   transmitting a second laser light having a wavelength that is the same as or different than the first laser light through the film,
   the etchant etching the substrate in a region defined by the second laser light so as to define the cavity under the film before exposing the first major film surface to the first fluidic precursor.

4. The method of claim 3, comprising exposing the film to the etchant and to the first fluidic precursor in a single gas cell.

5. The method of claim 1, wherein a material of the substrate has a higher thermal conductivity than a material of the film.

6. The method of claim 1, wherein the substrate has an upper surface, and wherein the film is disposed on the upper surface of the substrate.

7. The method of claim 1, wherein the substrate has an upper surface, and wherein the film is buried below the upper surface of the substrate.

8. The method of claim 1, wherein the film is substantially continuous.

9. The method of claim 1, wherein the film comprises silicon oxide, hafnium oxide, silicon nitride, or diamond-like carbon.

10. The method of claim 1, wherein the substrate comprises silicon, germanium, gallium phosphide, gallium nitride, gallium arsenide, or indium phosphide.

* * * * *